(12) United States Patent
Hirobe

(10) Patent No.: US 7,839,205 B2
(45) Date of Patent: Nov. 23, 2010

(54) STEP-DOWN CIRCUIT, SEMICONDUCTOR DEVICE, AND STEP-DOWN CIRCUIT CONTROLLING METHOD

(75) Inventor: Atsunori Hirobe, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 49 days.

(21) Appl. No.: 12/314,489

(22) Filed: Dec. 11, 2008

(65) Prior Publication Data
US 2009/0167421 A1    Jul. 2, 2009

(30) Foreign Application Priority Data
Dec. 27, 2007    (JP)    ............... 2007-336419

(51) Int. Cl.
*G05F 1/10*    (2006.01)
(52) U.S. Cl. ..................... 327/540; 327/534
(58) Field of Classification Search ............... 327/530, 327/534, 535, 537, 540, 541
See application file for complete search history.

(56) References Cited

U.S. PATENT DOCUMENTS 5,073,484 A    12/1991    Swanson et al.
6,326,837 B1 *    12/2001    Matano .................. 327/545
6,833,748 B2 *    12/2004    Cho ....................... 327/374
7,436,206 B2 *    10/2008    Kurotsu .................. 326/34

FOREIGN PATENT DOCUMENTS

JP    2000-57764    2/2000

* cited by examiner

*Primary Examiner*—Jeffrey S Zweizig
(74) *Attorney, Agent, or Firm*—McGinn Intellectual Property Law Group, PLLC

(57) ABSTRACT

A step-down circuit is connected between a power supply node for supplying a supply voltage and an internal power supply line for supplying a power to the object circuit and steps-down the supply voltage, and supplies the stepped-down voltage to the object circuit through the internal power supply line. The step-down circuit includes a comparison circuit that compares a reference voltage with the voltage of the internal power supply line, and a driver that adjusts a current flowing between the internal power supply line and the power supply node according to the comparison result of the comparison circuit. The activity level of the driver is controlled so as to rise in a predetermined rising period synchronously with an activated operation of the object circuit and to fall in a predetermined falling period that comes after the rising period.

23 Claims, 24 Drawing Sheets

STEP-DOWN CIRCUIT, SEMICONDUCTOR DEVICE, AND STEP-DOWN CIRCUIT CONTROLLING METHOD

BACKGROUND OF THE INVENTION

1. Field of the Invention

The present invention relates to a technique for stepping down a voltage, and more concretely to a technique for stepping down a supply voltage so as to be supplied to an object circuit.

This application has foreign priority benefits of Japanese Patent Application No. 2007-336419 having a Japanese filing date of Dec. 27, 2007.

2. Description of Related Art

In case of each of processing systems provided with circuits that operate with a supply voltage that is lower than the system supply voltage, the system uses a step-down circuit to step down the system supply voltage to a supply voltage that operates those circuits. For example, in the fields of such semiconductor devices as the DRAM (Dynamic Random Access Memory and the pseudo SRAM (Static Random Access Memory), their elements are kept micronized more and more along with the progress of high density packing and highly integration techniques of LSIs. And accordingly, the internal operation supply voltage is lowered to improve the reliability of those micronized elements and reduce the amplitude of signal lines, thereby speeding up the operations and reduce the current consumption. On the other hand, when compared with those semiconductor devices, external devices such as processors, etc. are not micronized so much. When forming a processing system with use of such semiconductor devices, therefore, the system supply voltage is determined by the supply voltage of the processor, etc. Consequently, when forming a processing system that uses a single power supply, the system is designed to use a step-down circuit that steps down the system supply voltage to generate the required internal supply voltage.

FIG. 23 is an explanatory diagram showing an example of such a step-down circuit. In FIG. 23, a circuit group 10 includes plural circuits (circuit 1, circuit 2, ..., circuit N) and those circuits are driven with a voltage (hereunder, to be referred to as an operation voltage) VINT0 that is lower than the system supply voltage VDD0. A step-down circuit 20 is driven according to a power supply enable signal VINTEN and the system supply voltage VDD0 is stepped down to the operation voltage VINT0 from the voltage VINT and supplied to the circuit group 10.

A circuit activation enable signal CE controls whether to activate/deactivate the circuit group 10. In the following description, an active period means a period during which an object circuit or circuit group is active and a standby period means a period other than the active period.

FIG. 24 is a diagram showing how the current consumption in the circuit group 10 changes, as well as how the voltage VINT and each signal supplied from the step-down circuit 20 make state changes while the circuit group 10 exits a standby period and enters an active period, then exits the active period and enters another active period.

As shown in FIG. 24, if the circuit activation enable signal CE is turned on while the circuit group 10 is in the standby period, the circuit group 10 is activated and enters the active period A1. Then, the power supply enable signal VINTEN is also turned on, thereby the step-down circuit 20 supplies the voltage VINT to the circuit group 10. At this time, the voltage VINT becomes the same as the operation voltage VINT0.

A curve L0 in FIG. 24 denotes how the voltage VINT changes in state. When the circuit group 10 is activated, beginning its current consumption. So, the voltage VINT goes lower than the operation voltage VINT0. Thus a so-called power supply drop occurs. The step-down circuit 20 then detects the power supply drop and raises the VINT up to the same level as that of the VINT0. However, it takes some time until the VINT corresponds to the current consumption of the circuit group 10. Hereunder, this period of time will be referred to as the step-down circuit response period A2.

If the circuit activation enable signal CE is turned off, the operation of the circuit group 10 ends and the circuit group 10 exits the active period A1 and enters the standby period. At this time, the current consumption of the circuit group 10 becomes 0. However, the step-down circuit 20 is required to supply charges continuously to the circuit group 10 so as to restore the power supply network and assure the stable capacity. Thus the power supply enable signal VINTEN is turned off later than the deactivated operation of the circuit group 10. This delay time is the restoration period A3 shown in FIG. 24. At the end of the restoration period A3, the voltage VINT is restored to the operation voltage VINT0.

Hereunder, this process will be examined from a viewpoint of the relationship between the charge supply capacity Qt of the step-down circuit 20 and the charge consumption Pt of the circuit group 10. In the period T1 that precedes the step-down circuit response period A2, the charge supply capacity Qt of the step-down circuit 20 is affected by the power supply drop and goes lower than the charge consumption Pt of the circuit group 10. Thus the voltage VINT begins falling step by step. And according to the restoration operation of the step-down circuit 20, in the period T2 that includes a succeeding step of the step-down circuit response period A2, the charge supply capacity Qt of the step-down circuit 20 comes to take approximately the same value as that of the current consumption Pt of the circuit group 10. As a result, the charge supply capacity Qt of the step-down circuit 20 exceeds the current consumption Pt of the circuit group 10 at the end point of the period T2, that is, at the start point of the period T3. Consequently, the power supply drop is eliminated.

The power supply drop functions a factor that causes troubles in the fast operation of circuits. Because the active period A1 becomes shorter when the circuit operation becomes faster while the step-down circuit response period A2 does not become short due to the power supply drop, the restoration period A3 is required to be long unavoidably. And because the voltage VINT is restored to the operation voltage VINT0 at the end point of the restoration period A3, the circuit group 10 cannot be activated during the restoration period A3. Thus the circuit group 10 cannot start the next operation. As the restoration period A3 becomes longer, it becomes difficult to keep the fast operation of the circuit group 10.

FIG. 25 shows an explanatory diagram of an internal power supply circuit 30 provided for plural memory cells and for a peripheral device. As shown in FIG. 25, the internal power supply circuit 30 includes a power supply terminal 31 for supplying the system supply voltage VDD0 and three step-down circuits 32. The internal power supply circuit 30 steps down the system supply voltage VDD0 and supplies the stepped-down voltage to an I/O interface 40, a peripheral logic circuit 50, and the plural memory cells 60.

The address and command buses consume large currents for writing/reading data to/from the memory. If the speed of the power supply responsibility is not insufficient, then the above-described power supply drop comes to become a significant one. Consequently, the sense-up driving performance falls, thereby it comes to take much time to amplify the memory cell signals.

Overdriving as described in, for example, the patent document 1 (Japanese Patent Application Laid Open No. 2000-57764) is one of the method for solving this problem. The overdriving method disclosed in the patent document 1 applies a voltage that is higher than the step-down circuit output to the sense-up PMOS side and a voltage that is lower than the ground potential to the sense-up NMOS side only when amplifying memory cell signals, thereby raising the transistor VSD to compensate the insufficient driving input.

FIG. 26 shows an explanatory diagram of a step-down circuit used for such overdriving. In FIG. 26, the same reference numerals are used for the same components as those in FIG. 23 for easier comparison between them.

In FIG. 26, the circuit group 10 is equivalent to the peripheral logic 50 or the group of the memory cells 60 in FIG. 25. OD denotes an overdrive signal. In a period in which this overdrive signal is turned on, the overdriving is carried out. Hereinafter, this period will be referred to as the overdriving period.

FIG. 27 is a timing chart for showing how the current consumption of the circuit group 10 changes, as well as the voltage VINT and each signal supplied from the step-down circuit 20 changes in state when the circuit group 10 exits a standby period and enters an active period, then exits the active period and enters another standby period after the overdriving is carried out as shown in the explanatory diagram in FIG. 26. The curve L1 in FIG. 27 denotes how the voltage VINT changes in such a case.

The overdrive signal OD is turned on synchronously with an activated operation of the circuit group 10. Then, overdriving is carried out. And when the overdriving period A4 reaches its end point, the overdrive signal OD is turned off, thereby the overdriving is deactivated. As shown in FIG. 27, when overdriving is carried out in such a way, the power supply drop value is reduced, the step-down circuit response period A2 is shortened, and the restoration period A3 is also shortened. In FIG. 27, the power supply drop is shown simply so as to be understood easily. The power supply drop can also be avoided completely by adjusting the voltage to be applied when carrying out overdriving. Such overdriving is effective to keep the fast speed of the circuit group 10.

SUMMARY

Overdriving to be carried out to prevent the over-drop as described above makes it possible to improve the power supply responsibility at the activation of the object circuit and shorten the step-down circuit response period A2, thereby shortening the restoration period A3. On the other hand, such overdriving is also expected to worsen the power supply responsibility of the object circuit at the deactivation of the circuit.

Usually, the resistance of a power supply network is lowered to speed up the subject system in operation. If overdriving is carried out in such a case, therefore, an excessive charge supply might occur. For example, as shown with the curve L2 in FIG. 27, the voltage VINT keeps rising even after the end of the restoration period A3. In this case, the circuit group 10 might be delayed at the start of the next operation. Furthermore, the operation of the circuit group 10 might become unstable. Thus the reliability compensation might fail, although it depends on the rated voltage of the circuit group 10.

In order to prevent such an excessive charge supply and improve the power supply responsibility at the deactivation of the object circuit, there might be conceivable a method, which grasps the amount of charge consumption during the operation of the circuit group 10 and adjusts the level for carrying out the subject overdriving according to the grasped charge consumption. This method premises that it is possible to predict the amount of the charge consumption during the operation of the circuit group 10. However, for example, in case of semiconductor devices such as the DRAM, the pseudo SRAM, etc., such an array current as a sense current of a memory bank can possibly be predicted. However, it is difficult to grasp the charge consumption of the peripheral logic in operation, since the current consumption is varied among operation patterns.

One of the exemplary forms of the present invention is a step-down circuit connected between a power supply node for supplying a supply voltage and an internal power supply line for supplying a power to an object circuit and used to step down the supply voltage to be supplied to the object circuit. This step-down circuit includes a comparison circuit for comparing a reference voltage with a voltage of the internal power supply line and a driver for adjusting a current flowing between the internal power supply line and the power supply node according to the comparison result of the comparison circuit. The activity level of the driver is controlled so as to rise in a predetermined high period synchronously with an activated operation of the object circuit and fall in a predetermined low period that comes after the high period.

Another exemplary form of the present invention is a semiconductor device. This semiconductor device includes a first object circuit; a first internal power supply line connected to the first object circuit; and a first step-down circuit connected between a power supply node that supplies a supply voltage and the first internal power supply line and used to step down the supply voltage to be supplied to the first object circuit through the first internal power supply line. The first step-down circuit includes a first comparison circuit that compares a first reference voltage with a voltage of the first internal power supply line; and a first driver that adjusts a current flowing between the first internal power supply line and the power supply node according to the comparison result of the first comparison circuit. The activity level of the first driver is controlled so as to rise synchronously with an activated operation of the first object circuit in a predetermined high period and fall in a low period that comes after the high period.

Another exemplary form of the present invention is a step-down circuit controlling method. This method controls the object step-down circuit, which is connected between a power supply node that supplies a supply voltage and an internal power supply line that supplies the supply voltage to an object circuit and used to step down the supply voltage to be supplied to the object circuit through the internal power supply line. The step-down circuit includes a comparison circuit that compares a voltage of the internal power supply line with a reference voltage and a driver that adjusts a current flowing between the internal power supply line and the power supply node according to the comparison result of the comparison circuit. The method controls the step-down circuit so that the activity level of the driver rises in a predetermined high period synchronously with an activated operation of the object circuit and falls in a low period that comes after the high period.

According to the techniques of the present invention, it is possible to realize a favorable power supply responsibility even at the activation and deactivation timings of an object circuit upon supplying a stepped-down supply voltage to the object circuit.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
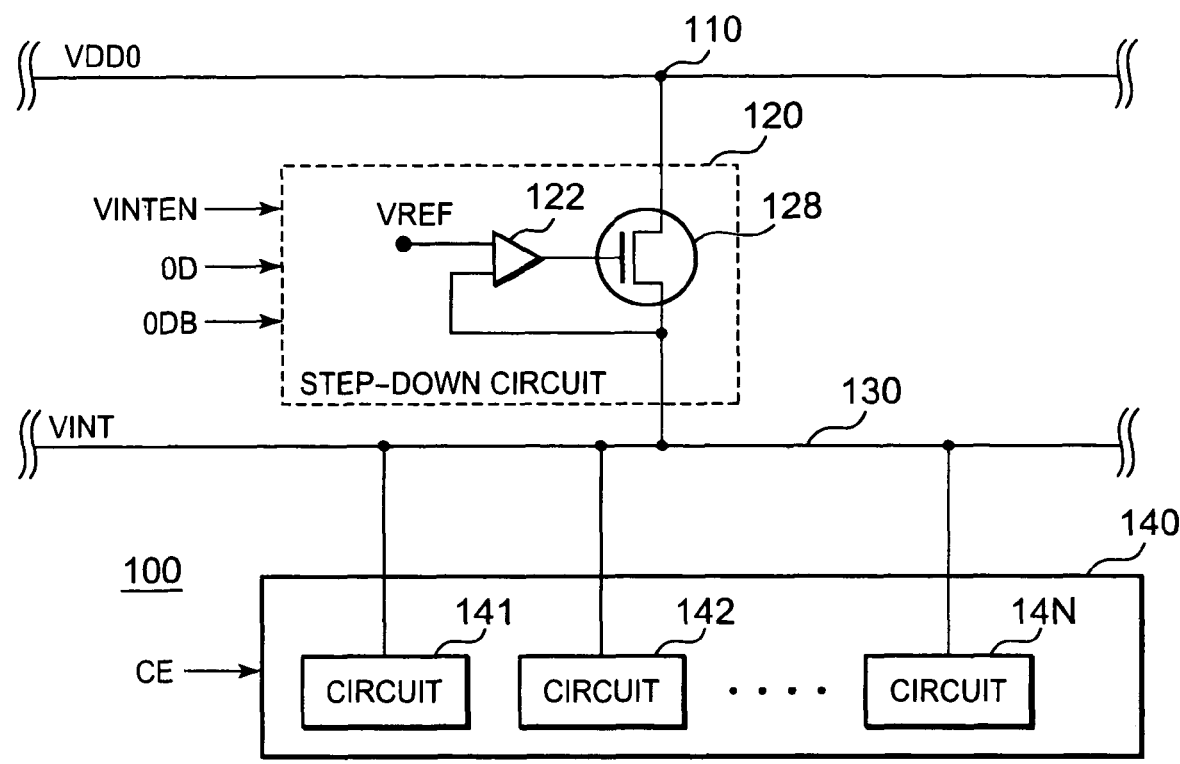
FIG. 1 is a block diagram of a semiconductor device in a first exemplary embodiment of the present invention.

FIG. 1 shows a semiconductor device 100 in this first exemplary embodiment of the present invention. The semiconductor device 100 includes a circuit group 140 and a step-down circuit 120 that steps down a system supply voltage 140, which is an external supply voltage, and supplies the stepped-down voltage to the circuit group 140. The step-down circuit 120 is connected between a power supply node 110 and an internal power supply line 130, as well as a comparison circuit 122 and a driver 128.

The circuit group 140 includes plural circuits and is activated synchronously with a circuit activation enable signal CE that is turned on in a standby period in which the circuit 140 is idle, then the circuit group 140 enters an active period. Then, synchronously with the circuit activation enable signal CE that is turned off in the active period, the circuit group 140 is deactivated and enters another standby period. The operation voltage of the circuit group 140 is premised to be VINT0.

The comparison circuit 122 compares the reference voltage VREF having the same value as that of the operation voltage VINT0 of the circuit group 140 with the voltage VINT of the internal power supply line 130.

The driver 128 adjusts the current flowing between the power supply node 110 and the internal power supply line 130 according to the comparison result of the comparison circuit 122. Concretely, the driver 128 adjusts the current flowing between the power supply node 110 and the internal power supply line 130 so that the voltage VINT of the internal power supply line 130 rises up to the reference voltage VREF when the voltage VINT of the internal power supply line 130 goes down under the reference voltage VREF (=VINT0).

The step-down circuit 120 inputs three control signals VINTEN, OD, and OB.

The VINTEN is a power supply enable signal. While this VINTEN is on, the comparison circuit 122 is kept active.

The OD denotes whether to increase the activity level of the driver 128. Hereunder, this OD control signal will be referred to as the overdrive signal. And raising the activity level of the driver 128 is referred to as overdriving.

The ODB control signal denotes whether to decrease the activity level of the driver 128. Hereunder, this ODB signal will be referred to as the overdrive backward signal. And lowering the activity level of the driver 128 is referred to as overdriving backward.

In this embodiment, the overdrive signal OD is turned on for a predetermined period (increasing period) synchronously with an activated operation of the circuit group 140 and the overdrive backward signal ODB is turned off for a predetermined period (decreasing period) synchronously with a deactivated operation of the circuit group 140. Consequently, the activity level of the driver 128 is raised synchronously with an activated operation of the circuit group 140 and lowered synchronously with a deactivated operation of the circuit group 140.

Next, there will be described overdriving for raising the activity level of the driver 128 and overdriving backward for lowering the activity level of the driver 128 to be carried out by various methods with reference to FIG. 2.

Figure 2:
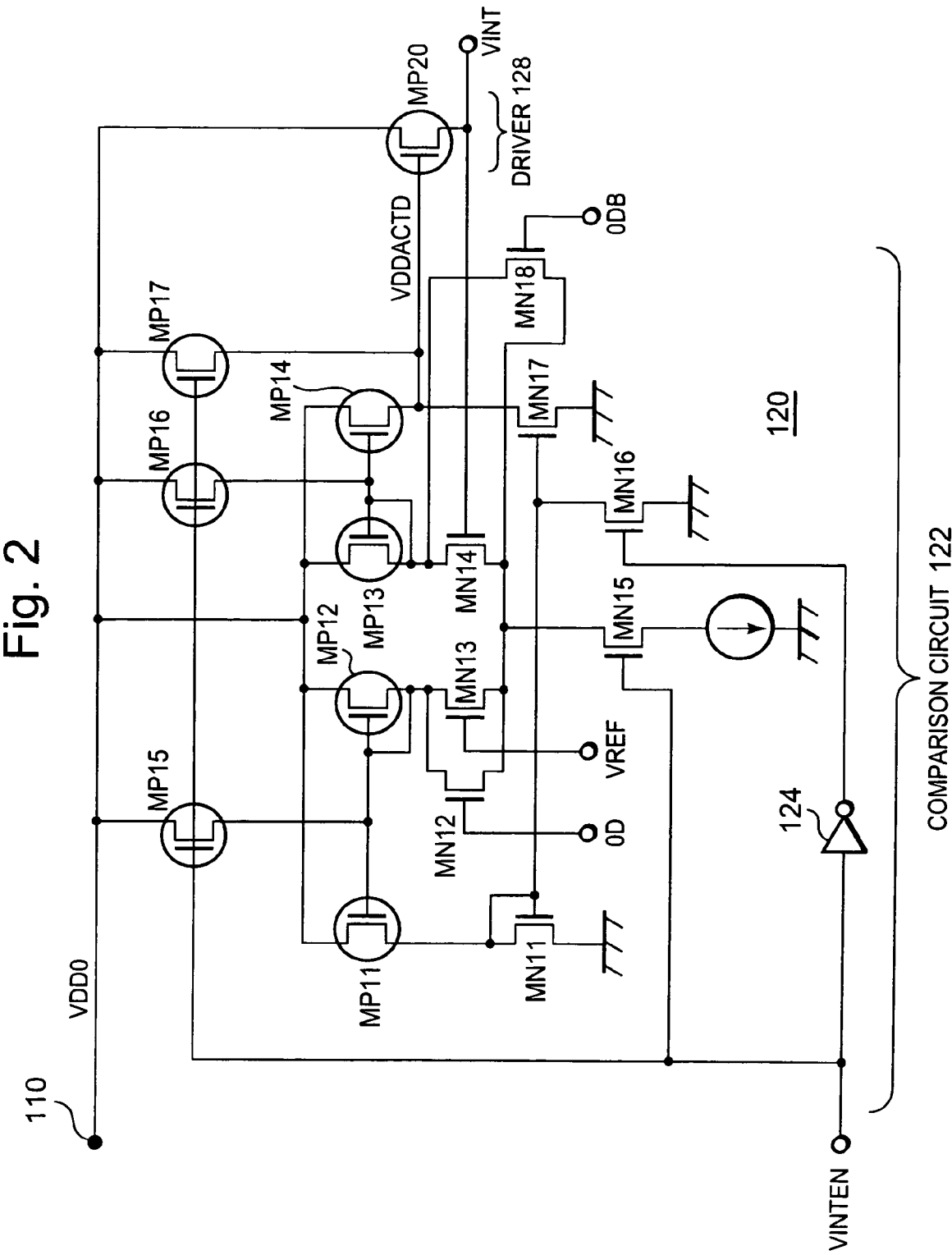
FIG. 2 is a block diagram of a step-down circuit in the semiconductor device shown in FIG. 1.

FIG. 2 shows an example of the step-down circuit 120 that carries out both overdriving and overdriving backward. As shown in FIG. 2, the comparison circuit 122 includes N-channel MOS transistors MN11 to MN18, P-channel MOS transistors MP11 to MP17, a constant power supply 126, and an inverter 124. The driver 128 includes a P-channel MOS transistor MP20.

The MP15, MP16, and MP17 have sources respectively that are connected in parallel to the system supply voltage VDD0. Their gates input the power supply enable signal VINTEN respectively. The power supply enable signal VINTEN determines whether to activate the comparison circuit 122. This power supply enable signal VINTEN is turned on synchronously with an activated operation of the circuit group 140. The drain of the MP17 is connected to the gate of the MP20.

The drain of the MP15 is connected to the drain of the MP11 and MP12 commonly. The gates of the MP11 and MP12 are connected to each other and their sources are connected to the system supply voltage VDD0 to form a current mirror. The MP12 has a gate and a drain that are short-circuited. The drain of the MP11 is connected to the source of the NM11. The MN11 has a gate and a source that are short-circuited.

The drain of the MP12 is connected to the drains of the MN13 and the MN12. The MN13 and MN12 are connected to each other in parallel. Their sources are connected to the drain of the MN15. The gate of the MN13 inputs the VREF. The gate of the MN12 inputs the overdrive signal OD. The MN15 is connected to the constant current source 126 of which source is grounded. The gate of the MN15 inputs the power supply enable signal VINTEN.

The gate of the MP13 is connected to the gate of the MP14 and those gates are connected to the drain of the MP16. The sources of the MP13 and MP14 input the system supply voltage VDD0 respectively to form a current mirror. In the MP13, its gate and drain are short-circuited. The drain of the MP13 is connected to the drain of the MN14. The source of the MN14 is connected to the drain of the MN15 and the gate of the MN14 is connected to the drain of the MP20. The drain of the MP20 outputs the VINT.

The drain of the MP13 is connected to the drain of the MN18. The source of the MN18 is connected to the drain of the MN15 and the gate of the MN18 inputs the overdrive backward signal ODB.

The drain of the MP14 is connected to the drain of the MN17. The gate of the MN17 is connected to the gate of the MN11 and the drain of the MN16 respectively and the source of the MN17 is grounded. The MN16 has a source grounded and a gate that inputs the power supply enable signal VINTEN inverted by the inverter 124.

In the driver 128, the MP20 has a source connected to the system supply voltage VDD0 and a gate connected to the drains of the MP17 and MP14 respectively and used to input the gate voltage VDDACTD.

Next, there will be described the operation of the step-down circuit 120. At first, there will be described a case in which the overdrive signal OD and the overdrive backward signal ODB are off, that is, a case in which the activity level of the driver 128 is not adjusted. In this case, the MN12 of which gate inputs the overdrive signal OD and the MN18 of which gate inputs the overdrive backward signal ODB are off respectively.

When the power supply enable signal VINTEN is off, the MP15, MP16, and MP17 are turned on and the MP11 to MP14, as well as the MP20 are turned off, thereby both the VINT and the reference voltage VREF are on the same level. At this time, the comparison circuit 122 is idle.

Synchronously with the power supply enable signal VINTEN that is turned on, the circuit group 140 is activated. At this time, the MP15 to MP17, as well as the MN16 are turned off and the MN15 is turned on. As a result, the comparison circuit 122 and the driver 128 are activated.

If the VINT falls in level due to the current consumption of the circuit group 140, which is activated, the current flowing in the MN11 and MN17 increases while the current flowing in the MP14 decreases. Consequently, the gate voltage VDDACTD of the MP20 falls in level, thereby the driver 128 is activated and the VINT rises up to the reference voltage.

Next, there will be described the operation of the comparison circuit when the overdrive signal OD and the overdrive backward signal ODB are on. The overdrive signal OD is turned on only in a predetermined period synchronously with an activated operation of the circuit group 140 and the overdrive backward signal ODB is turned on only in a predetermined period synchronously with a deactivated operation of the circuit group 140. The overdrive signal OD and the overdrive backward signal ODB are never turned on simultaneously.

In a period in which the overdrive signal OD is turned on, the MN12 is also turned on, so that a large current comes to flow in the MN12. In this state, the reference voltage VREF rises in a pseudo manner. Consequently, the gate voltage VDDACTD of the MP20 further falls until the overdrive signal OD is turned on. The activity level of the driver 128 thus rises and the VINT rises faster.

On the other hand, in a period in which the overdrive backward signal ODB is turned on, the MN18 is also turned on and the current flowing in the MP14 increases and the current flowing in the MN17 decreases. Consequently, the gate voltage VDDACTD of the MP20 decreases less than in a case in which the overdrive backward signal ODB is not turned on, thereby the activity level of the driver 128 falls and the VINT rises slowly.

Figure 3:
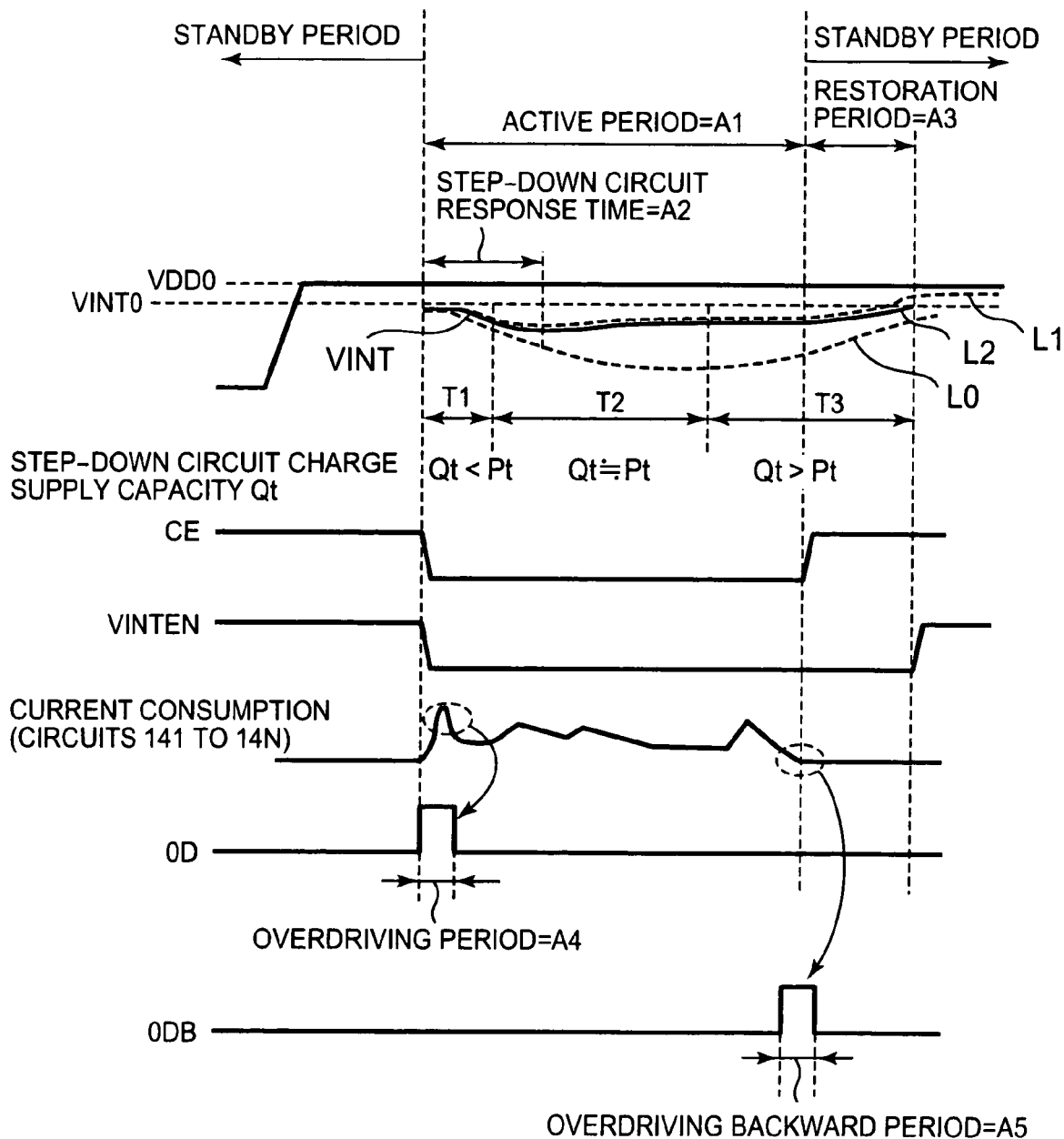
FIG. 3 is a timing chart for showing how each signal changes in state in the semiconductor device shown in FIG. 1.
Figure 27:
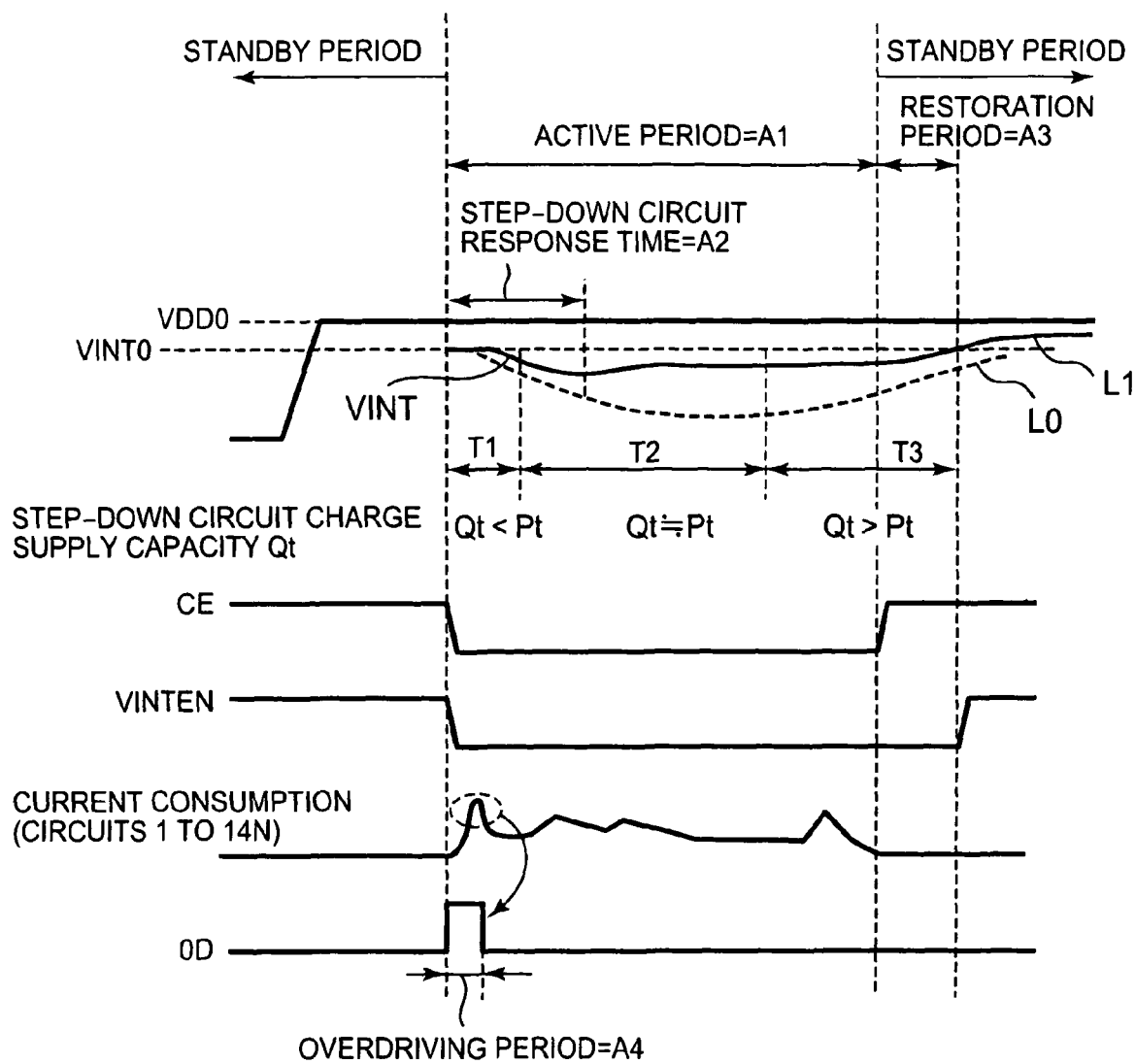
FIG. 27 is a timing chart for showing how each signal changes in state in the step-down circuit shown in FIG. 26.

FIG. 3 shows how the current consumption changes and how the voltage VINT of the internal power supply line 130 and each signal change in state in the semiconductor device 100 shown in FIG. 1 in a transition process in which the device 100 exits a standby period and enters an active period, then exits the active period and enters another standby period. The curve L2 in FIG. 3 denotes how the state of the VINT changes in the device 100. In FIG. 3, both the curve L0 and the curve L1 are also denoted for comparison. The curve L0 denotes how the state of the VINT changes when none of overdriving and overdriving backward are carried out and the curve L1 denotes how the state of the VINT changes when overdriving is carried out and overdriving backward is not carried out. Furthermore, the curves L0 and L1 in FIG. 3 are the same as those in FIG. 27.

As shown in FIG. 3, the circuit group 140 is activated synchronously with the circuit activation enable signal CE, thereby the circuit group 140 begins consuming the current. At this time, the voltage VINT of the internal power supply line 130 falls, but the driver 128 of the step-down circuit 120 is activated to raise the VINT.

Furthermore, in this embodiment, the activity level of the driver 128 is raised by an activated operation of the circuit group 140 in a predetermined period (the overdriving period A4 in FIG. 3), so the rising speed of the VINT is quickened more than when the overdriving is not carried out (as denoted by the curve L0). Consequently, the power supply responsibility of the circuit group 140 at the activation time is improved.

Furthermore, after the overdriving period A4 ends, in this embodiment, the activity level of the driver 128 is lowered in a predetermined period (the overdriving backward period A5 in FIG. 3) synchronously with the deactivation of the circuit group 140. Consequently, the rising speed of the VINT slows down more than when the overdriving backward is not carried out (as denoted by the curve L1). This embodiment therefore can prevent excessive charge supplying to be caused by carried-out overdriving. After the overdriving backward ends, the voltage VINT of the internal power supply line 130 is restored to the proper voltage quickly.

Furthermore, because the activity level of the driver 128 is lowered intentionally in the overdriving backward period A5, the power supply responsibility of the circuit group 140 can be improved even when the current consumption of the circuit group 140 cannot be estimated.

Second Exemplary Embodiment

The semiconductor device 100 in the above first exemplary embodiment is provided with one step-down circuit 120 with respect to the circuit group 140. The technique of this second exemplary embodiment can also apply to a semiconductor device provided with plural step-down circuits.

Figure 4:
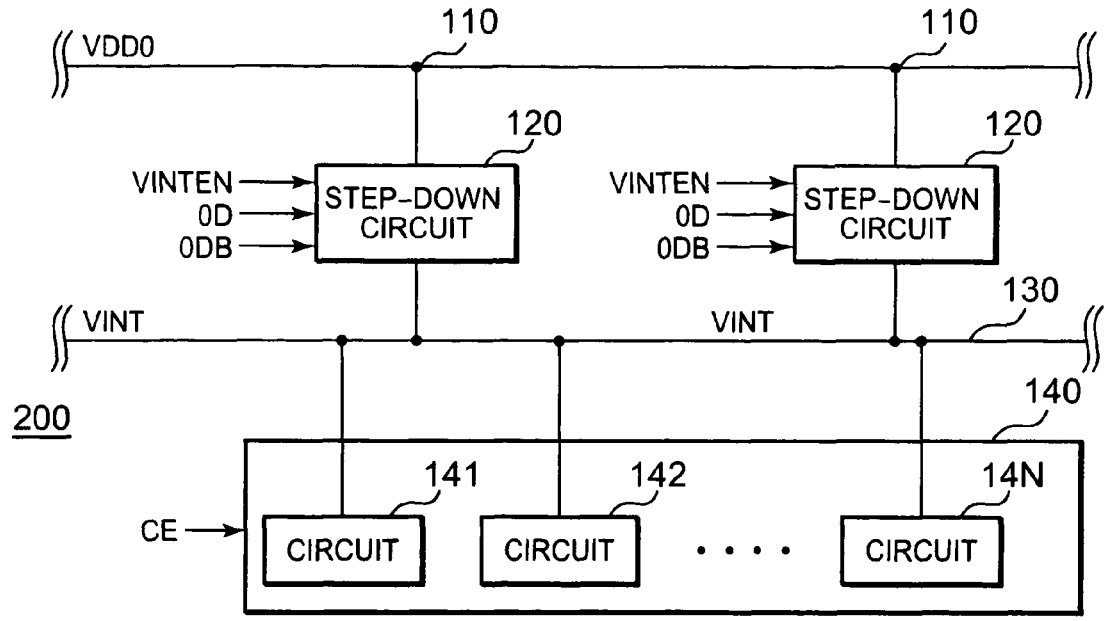
FIG. 4 is a block diagram of a semiconductor device in a second exemplary embodiment of the present invention.

FIG. 4 shows a semiconductor device 200 in this second exemplary embodiment. In FIG. 4, the same reference numerals are used for the same functional components as those of the semiconductor device 100 shown in FIG. 1, avoiding redundant description.

As shown in FIG. 4, in the semiconductor device 200, plural step-down circuits 120 (two circuits in FIG. 4) are provided in parallel with respect to the circuit group 140. Those step-down circuits 120 are equivalent to the step-down circuit 120 provided in the semiconductor device 100 shown in FIG. 1 respectively, so the description for them will be omitted here.

The technique of the present invention can also apply to a case in which plural step-down circuits are provided for an object circuit group including plural circuits just like the semiconductor device 200. Thus the technique of the present invention in this second exemplary embodiment can also obtain the same effect as that of the semiconductor device 100.

Third Exemplary Embodiment

Figure 5:
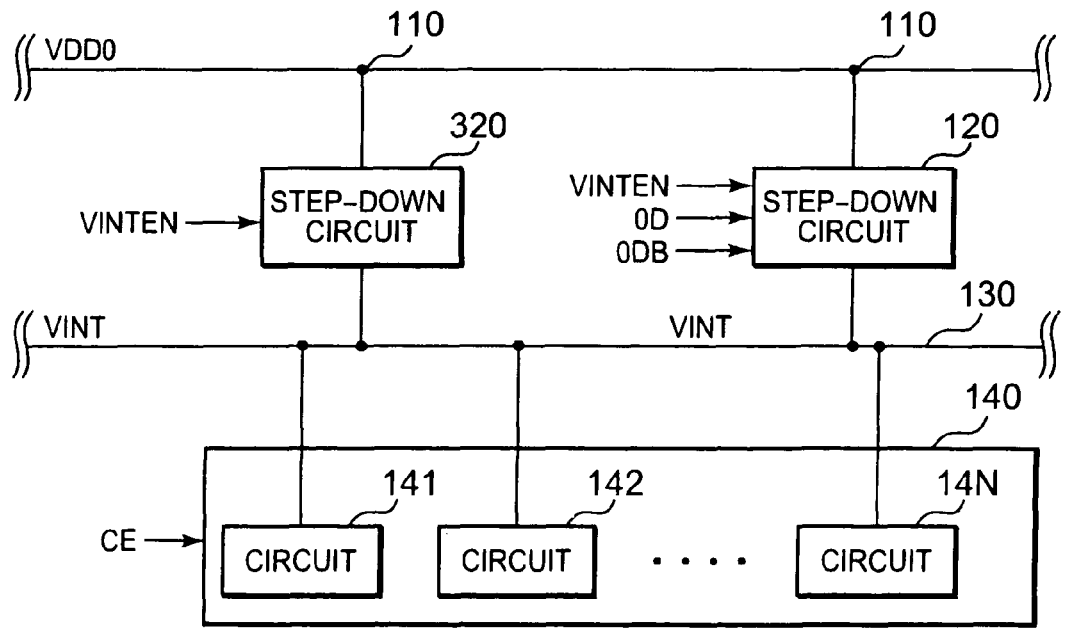
FIG. 5 is a block diagram of a semiconductor device in a third exemplary embodiment of the present invention.

FIG. 5 shows a semiconductor device 300 in this third exemplary embodiment of the present invention. The semiconductor device 300 is also realized by applying the technique of the present invention to a semiconductor device provided with plural step-down circuits. In FIG. 5, the same reference numerals are used for the same functional components as those of the semiconductor device 200 shown in FIG. 4, avoiding redundant description.

As shown in FIG. 5, in the semiconductor device 300, plural step-down circuits 140 (two circuits in FIG. 5) are provided in parallel with respect to a circuit group 140. Those two step-down circuits are the step-down circuits 320 and 120. Among the circuits included in the circuit group 140, the circuit 14N is high in current consumption.

The step-down circuit 120 is configured so as to carry out both overdriving and overdriving backward (e.g., reversely). The step-down circuit 320 is a conventional one that does not carry out any of the overdriving and the overdriving backward.

The step-down circuit 120 disposed near the circuit 14N supplies a current to the circuit 14 consuming much current. This means that the semiconductor device 300 in this third exemplary embodiment, when plural step-down circuits are provided for an object circuit group, is configured so that overdriving and overdriving backward are carried out only in a step-down circuit that supplies a current to one of the circuits in the object circuit group, which consumes much current. Other step-down circuits are all conventional ones that are not required to carry out any of overdriving and overdriving backward. Those conventional step-down circuits supply a current to the circuits that do not consume much current respectively.

Power supply drops often occur near circuits consuming much current respectively. In this third exemplary embodiment, therefore, the technique of the present invention applies only to step-down circuits for supplying a current to such circuits that consume much current. This is why favorable power supply responsibility is assured at both activation and deactivation timings of the object circuit group. Furthermore, this embodiment can reduce the scale of each step-down circuit, thereby enabling the whole circuitry scale of the subject semiconductor device to be reduced.

Fourth Exemplary Embodiment

The semiconductor device in any of the first to third exemplary embodiments described above is an example in which the circuits receiving current supplies from step-down circuits respectively are activated/deactivated at the same timing. Furthermore, the technique of the present invention can also apply even to any semiconductor device that has those circuits receiving current supplies from step-down circuits respectively and are activated/deactivated at different timings.

Figure 6:
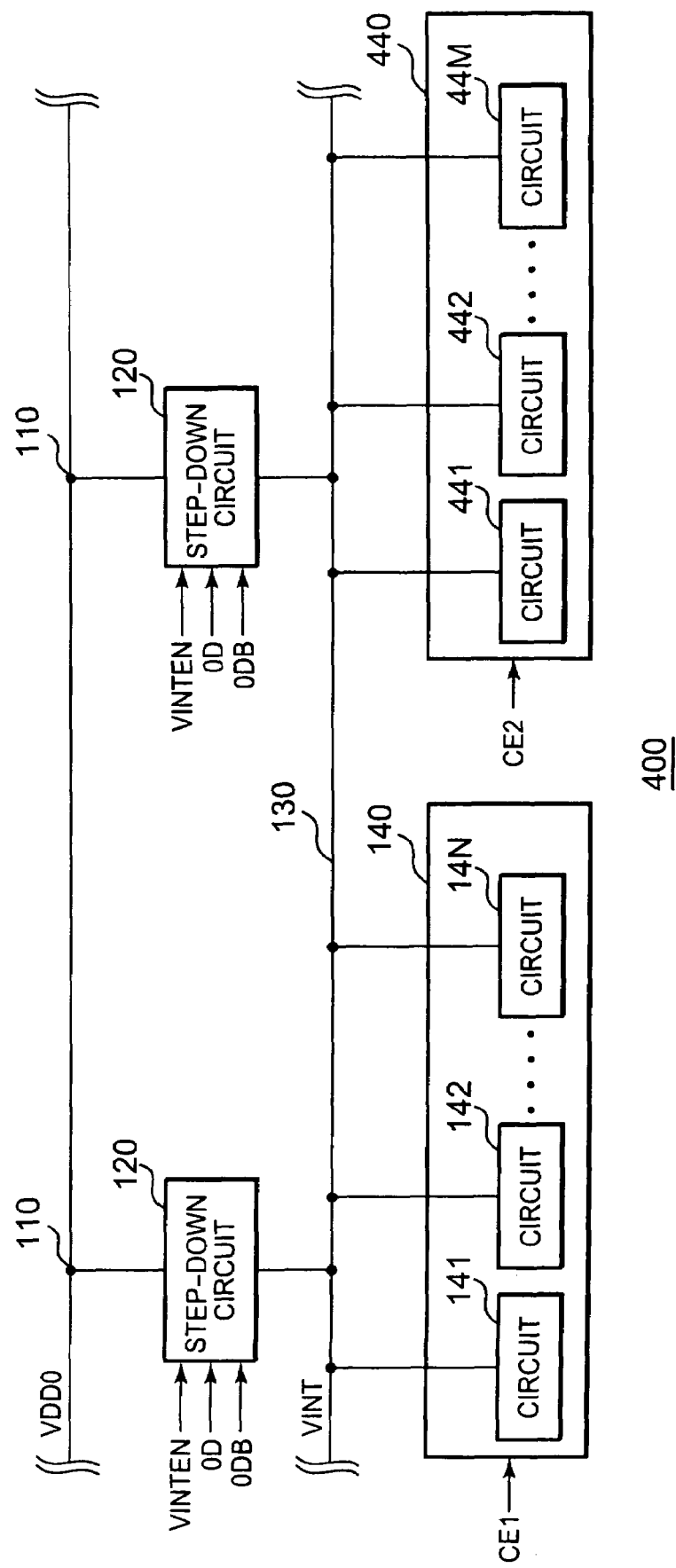
FIG. 6 is a block diagram of a semiconductor device in a fourth exemplary embodiment of the present invention.

FIG. 6 shows a semiconductor device 400 in this fourth exemplary embodiment. In the semiconductor 400, the circuit group 140 and the circuit group 440 are activated/deactivated according to the on/off timings of the circuit activation enable signal CE1 and the circuit activation enable signal CE2 respectively and their activation and deactivation timings are different from each other.

Plural step-down circuits 120 (two in FIG. 6) are provided between the power supply node 110 and the internal power supply line 130. The step-down circuit 120 is controlled by the overdrive signal OD and the overdrive backward signal ODB so as to carry out overdriving in a predetermined period synchronously with an activated operation of each of the circuit groups 140 and 440 and to carry out overdriving backward in a predetermined period synchronously with a deactivated operation of each of the circuit groups 140 and 440.

Figure 7:
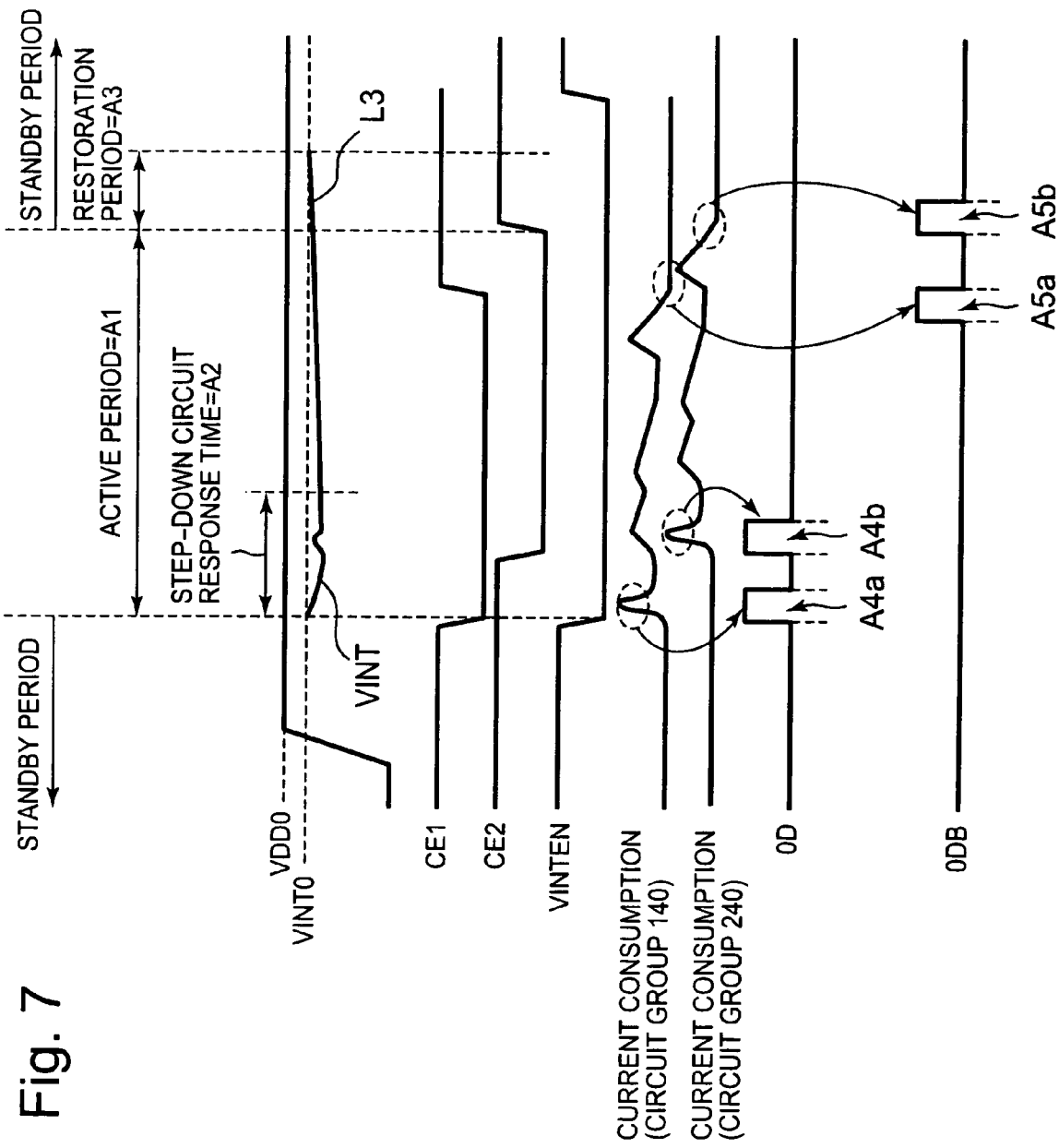
FIG. 7 is a timing chart for showing how each signal changes in state in the semiconductor device shown in FIG. 6.

FIG. 7 shows how the current consumption changes and how the voltage VINT of the internal power supply line 130 and each signal change in state in the semiconductor device 400 shown in FIG. 6 in a transition process in which the device circuits 140 and 440 exit a standby period and enters an active period, then exits the active period and enters another standby period respectively. The curve L3 in FIG. 7 denotes how the state of the VINT changes in the device 400.

As shown in FIG. 7, the circuit group 140 is activated synchronously with the circuit activation enable signal CE1, thereby beginning to consume the current. At this time, the voltage VINT of the internal power supply line 130 falls, but the driver 128 of the step-down circuit 120 is activated to raise the VINT.

Furthermore, in this embodiment, the overdrive signal OD is turned on in a predetermined period (the first overdriving period A4a) synchronously with an activated operation of the circuit group 140, thereby overdriving is carried out to raise the activity level of the driver 128.

After this, the circuit group 440 is activated by the circuit activation enable signal CE2 that is turned on. Then, in response to this activation of the circuit group 440, the overdrive signal OD is turned on again in the second overdriving period A4*b* shown in FIG. 7, thereby the second overdriving is carried out.

The operations of the circuit groups 140 and 440 continue on, then the circuit group 140 is deactivated first. Then, in the first overdriving backward period A5*a* shown in FIG. 7, the overdrive backward signal ODB is turned on to carry out the subject overdriving backward.

After this, the circuit group 440 is also deactivated. Then, in the second overdriving backward period A5*b*, the overdrive backward signal ODB is turned on again to carry out the second overdriving backward.

In such a way, the technique of the present invention can also apply to any object circuit group having plural circuits to be activated/deactivated at different timings. In this case, the power supply responsibility can be improved in any of those circuits even at their activation/deactivation timings.

In this embodiment, plural step-down circuits are provided. However, this embodiment can also apply to a case in which only one step-down circuit is provided.

Variation of the Fourth Exemplary Embodiment

Figure 8:
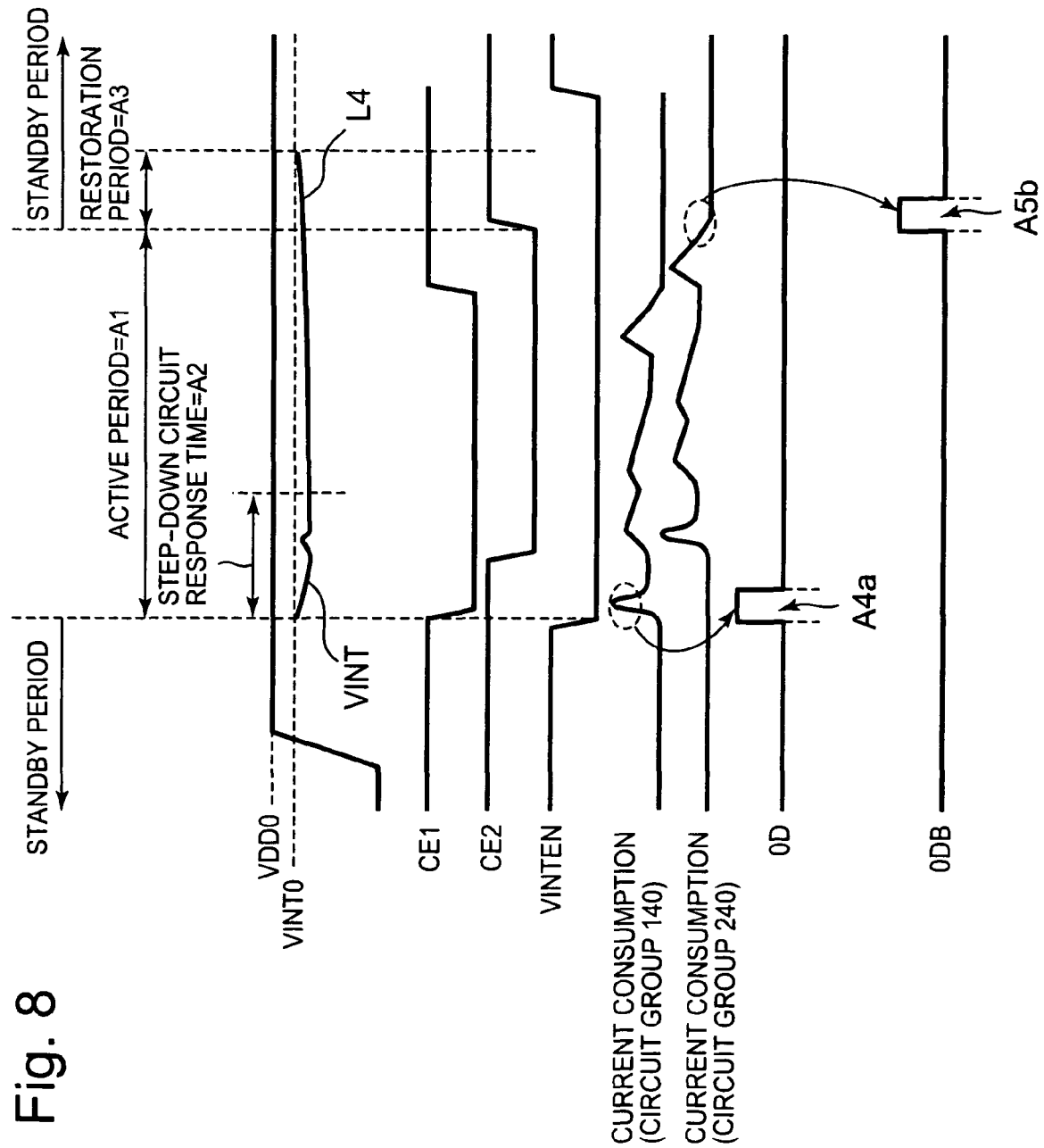
FIG. 8 is a timing chart for describing a variation of the semiconductor device shown in FIG. 6.

In this variation, the semiconductor device 400 is configured to carry out overdriving/overdriving backward at the activation/deactivation timing of each of the circuit groups 140 and 440. If the activation/deactivation timings of those circuit groups differ from each other and if another circuit group is activated while one circuit group is already active, such overdriving can also be carried out only in a predetermined period at the activation timing of the precedingly activated circuit group. If another circuit group is already active when the preceding circuit group is deactivated, overdriving backward may be carried out only in a predetermined period at the deactivation timing of the circuit group that is to be deactivated later. FIG. 8 shows how each signal changes in state in such a case. In this example, the circuit group 140 is deactivated first, then the circuit group 440 is deactivated. The curve L4 in FIG. 8 denotes how the voltage VINT changes in the internal power supply line 130.

As shown in FIG. 8, in the first overdriving period A4*a* when the operation of the circuit group 140 to be activated preceedingly starts, the overdrive signal OD is turned on to carry out overdriving. On the other hand, when the circuit group 440 to be activated while the circuit group 140 is active, the overdrive signal OD is kept off, thereby overdriving is not carried out.

Furthermore, at the deactivation timing of the circuit group 140 to be deactivated first, the overdrive backward signal ODB is kept off, so overdriving backward is not carried out. On the other hand, in the second overdriving backward period at the deactivation timing of the circuit group 440 to be deactivated later, the overdrive backward signal ODB is turned on to carry out overdriving backward.

In such a way, the circuit groups 140 and 440 are regarded as one integrated object circuit and overdriving/overdriving backward is carried out at the activation/deactivation timing of the entire object circuit. As a result, the power supply responsibility can be improved even at any of the activation/deactivation timings and the activity level of the driver can be prevented from excessive rising and excessive falling.

Fifth Exemplary Embodiment

In each of the second to fourth exemplary embodiments, the technique of the present invention applies to a semiconductor device in which plural step-down circuits are connected to each another in parallel. The technique of the present invention can also apply to any semiconductor device in which plural step-down circuits are connected to each another serially.

Figure 9:
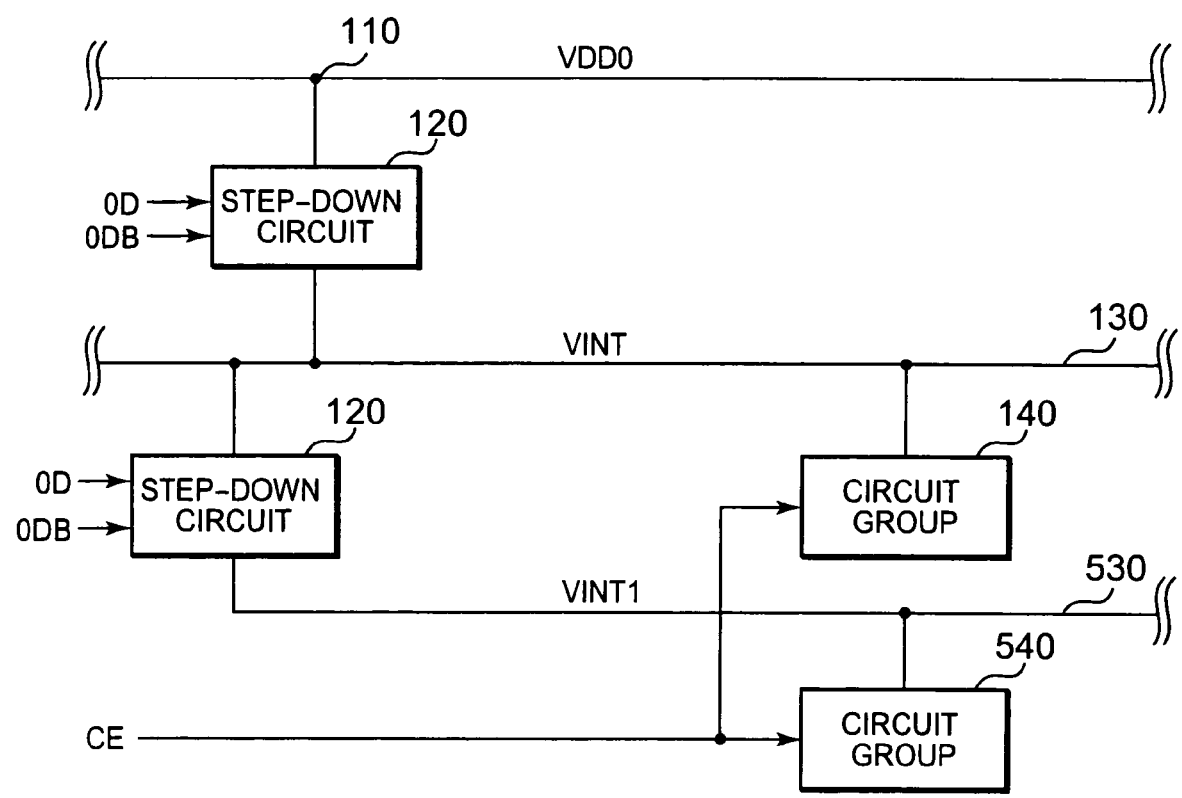
FIG. 9 is a block diagram of a semiconductor device in a fifth exemplary embodiment of the present invention.

FIG. 9 shows a semiconductor device 500 in this fifth exemplary embodiment. In the semiconductor device 500, two step-down circuits 120 are connected to each other serially. The step-down circuits 120 supply currents to the circuit groups 140 and 540 respectively. In FIG. 9, the same reference numerals are used for the same functional components as those in the above first to fourth exemplary embodiments, avoiding redundant description.

The circuit group 140 is connected to an internal power supply line 130 and receives a current supply from the step-down circuit 120 connected between a power supply node 110 and an internal power supply line 130. The voltage of the internal power supply line 130 is described as VINT.

The circuit group 540 is connected to an internal power supply line 530 and receives a current supply from the step-down circuit 120 connected between an internal power supply line 130 and an internal power supply line 530. The voltage of the internal power supply line 530 is described as VINT1.

The same circuit activation enable signal CE is used to activate/deactivate the circuit groups 140 and 540 respectively. The activation/deactivation timings are the same between those circuit groups 140 and 540. The two step-down circuits 120 are controlled by the overdrive signal OD and the overdrive backward signal ODB so as to carry out overdriving in a predetermined period at the activation timings of the circuit groups 140 and 540 and to carry out overdriving backward in a predetermined period at the deactivation timings of the circuit groups 140 and 540.

Figure 10:
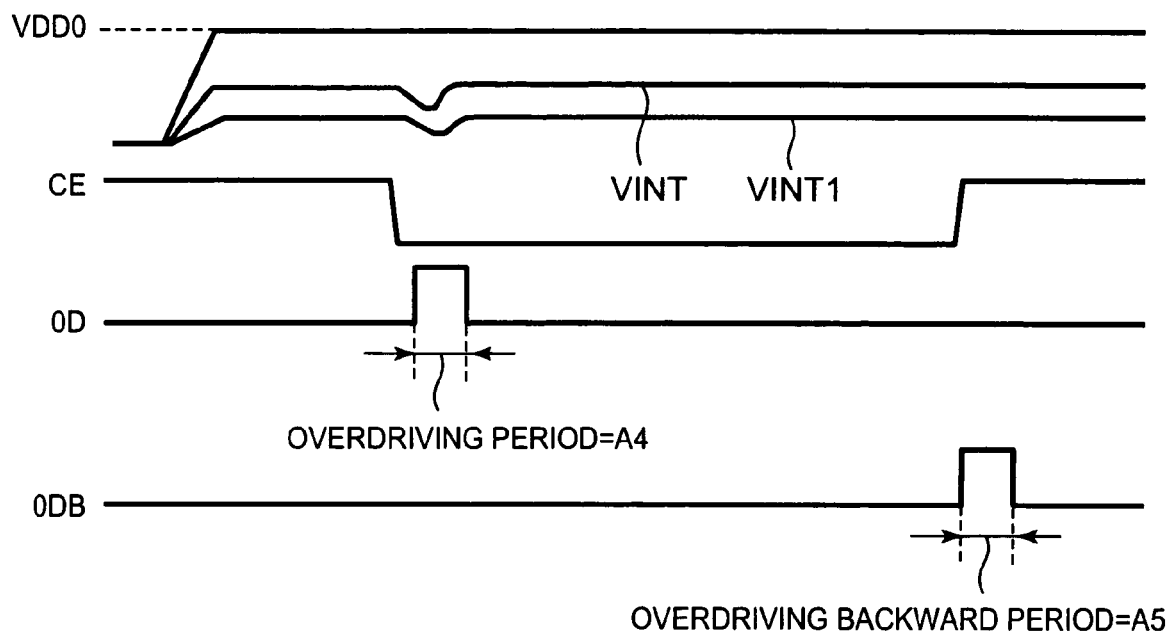
FIG. 10 is a timing chart for showing how each signal changes in state in the semiconductor device shown in FIG. 9.

FIG. 10 shows how each of the voltages INIT and VINT1, the circuit activation enable signal CE, the overdrive signal OD, and the overdrive backward signal ODB change in state in the semiconductor device 500 shown in FIG. 9 in a transition process in which the device circuits 140 and 540 exit a standby period and enters an active period, then exits the active period and enters another standby period respectively.

As shown in FIG. 10, in the overdriving period A4 when the circuit groups 140 and 540 are activated, the overdrive signal OD is turned on in the two step-down circuits 140 and 540 to carry out overdriving. And in an overdriving period A5 when the circuit groups 140 and 540 are deactivated, the overdrive backward signal ODB is turned on to carry out overdriving backward.

As described above, the technique of the present invention can also apply to a semiconductor device having plural step-down circuits connected to each another serially. And applying the technique of the present invention can improve the power supply responsibility at both activation and deactivation timings of the object circuit receiving current supplies from those step-down circuits.

Sixth Exemplary Embodiment

Figure 11:
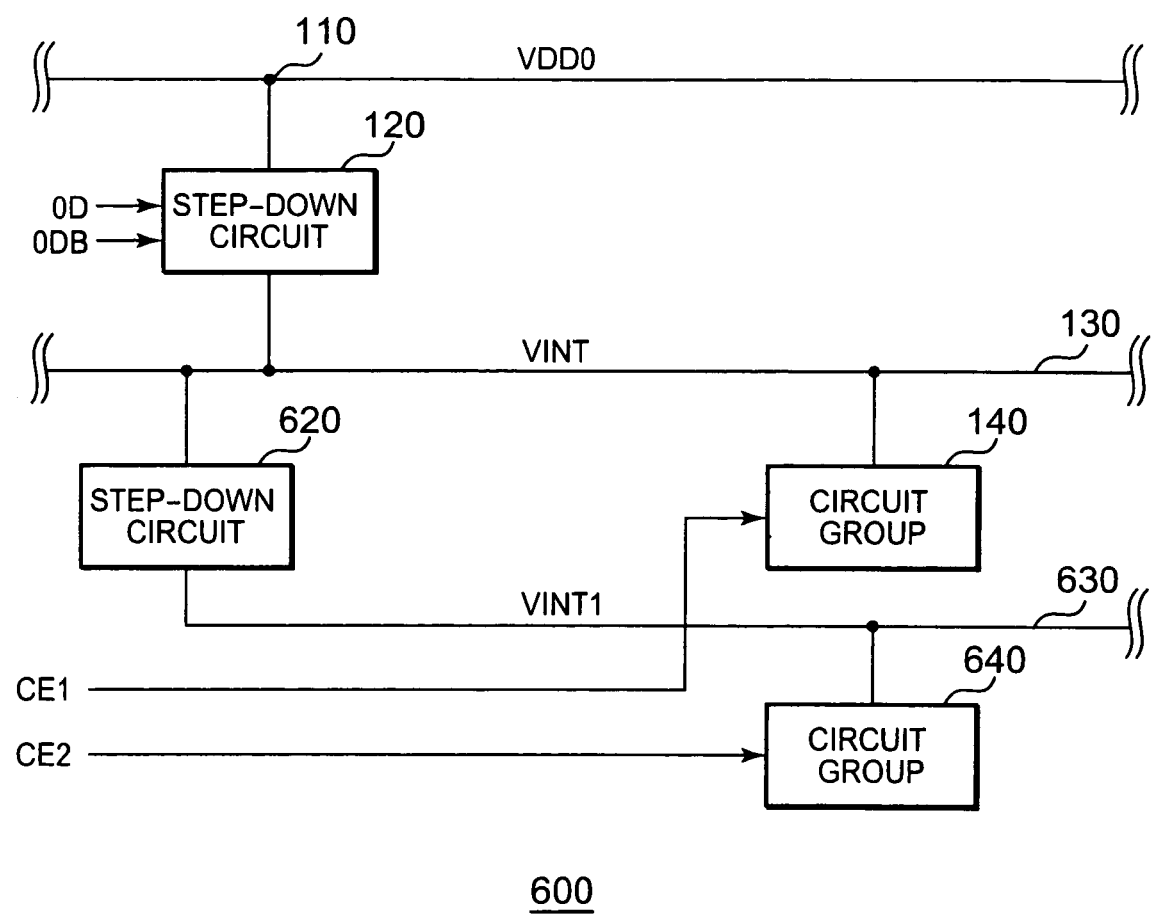
FIG. 11 is a block diagram of a semiconductor device in a sixth exemplary embodiment of the present invention.

FIG. 11 shows a semiconductor device 600 in this sixth exemplary embodiment. This semiconductor device 600 is also realized by applying the technique of the present invention to a semiconductor device having plural step-down circuits (two in FIG. 11) connected to each another serially.

In the semiconductor device 600, the step-down circuit 120 is connected between an internal power supply line 130 and a power supply node 110. The step-down circuit 120 steps down the system supply voltage VDD0 to VINT to be supplied to the circuit group 140 and the step-down circuit 620 respectively. The step-down circuit 120 carries out both overdriving and overdriving backward.

The step-down circuit 620 is connected between an internal power supply line 130 and an internal power supply line 630. The step-down circuit 620 steps down the voltage of the internal power line 130 to a voltage to be supplied to the circuit group 640. The step-down circuit 620 is an ordinary step-down circuit and does not carry out any of overdriving and overdriving backward.

The circuit group 140 is activated/deactivated by the circuit activation enable signal CE1 and the circuit group 640 is activated/deactivated by the circuit activation enable signal CE2. The activation/deactivation timing differs between those circuit groups 140 and 640.

Figure 12:
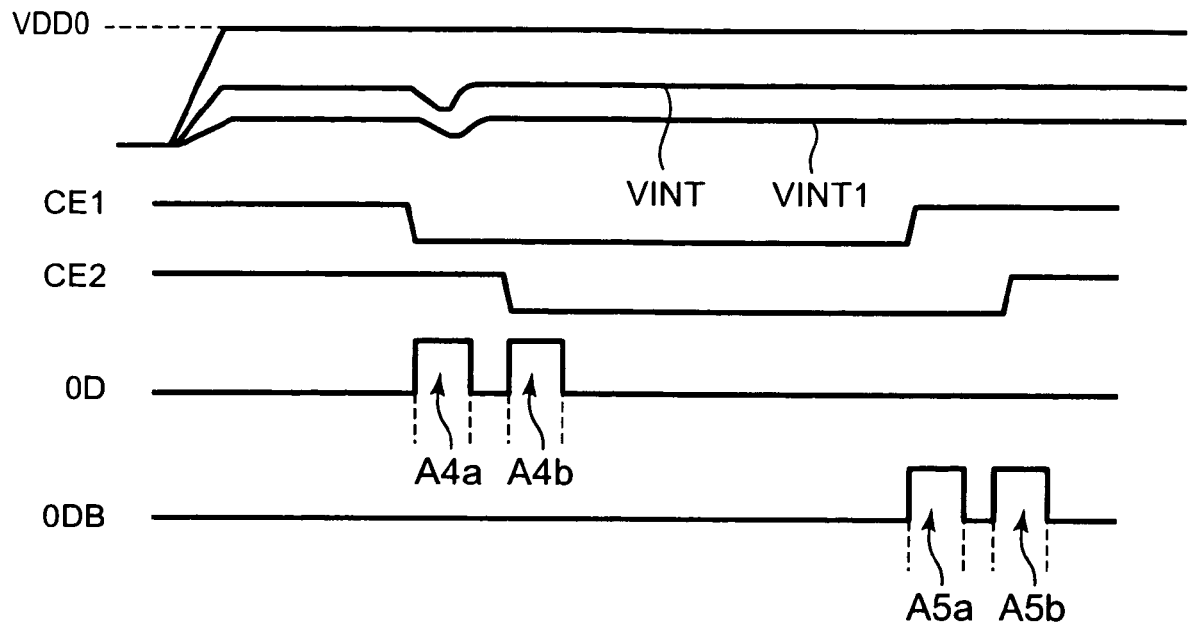
FIG. 12 is a timing chart for showing how each signal changes in state in the semiconductor device shown in FIG. 11.

FIG. 12 shows how each of the voltages VINT and VINT1, the circuit activation enable signal CE1, the circuit activation enable signal CE2, the overdrive signal OD, and the overdrive backward signal ODB change in state in the semiconductor device 600 shown in FIG. 11 in a transition process in which the device circuits 140 and 640 exit a standby period and enters an active period, then exits the active period and enters another standby period respectively.

As shown in FIG. 12, in the step-down circuit 120, the overdrive signal OD is turned on in the first overdriving period A4*a* synchronously with an activated operation of the circuit group 140 to carry out overdriving. After this, the overdrive signal OD is turned on again in the second overdriving period A4*b* synchronously with the activation timing of the circuit group 640 to carry out the second overdriving. On the other hand, the overdrive backward signal ODB is turned on in the first overdriving backward period A5*a* synchronously with the deactivation timing of the circuit group 140 to carry out overdriving backward. Then, the overdrive backward signal ODB is turned on in the second overdriving backward period A5*b* synchronously with a deactivated operation of the circuit group 640 to carry out the second overdriving backward.

In other words, in the semiconductor device 600 in this embodiment, the circuit groups 140, 620, and 640 are regarded as one integrated object circuit group and the step-down circuit 120 carries out overdriving/overdriving backward synchronously with the activated/deactivated operation of each circuit included in this object circuit group.

Variation of the Sixth Exemplary Embodiment

Figure 13:
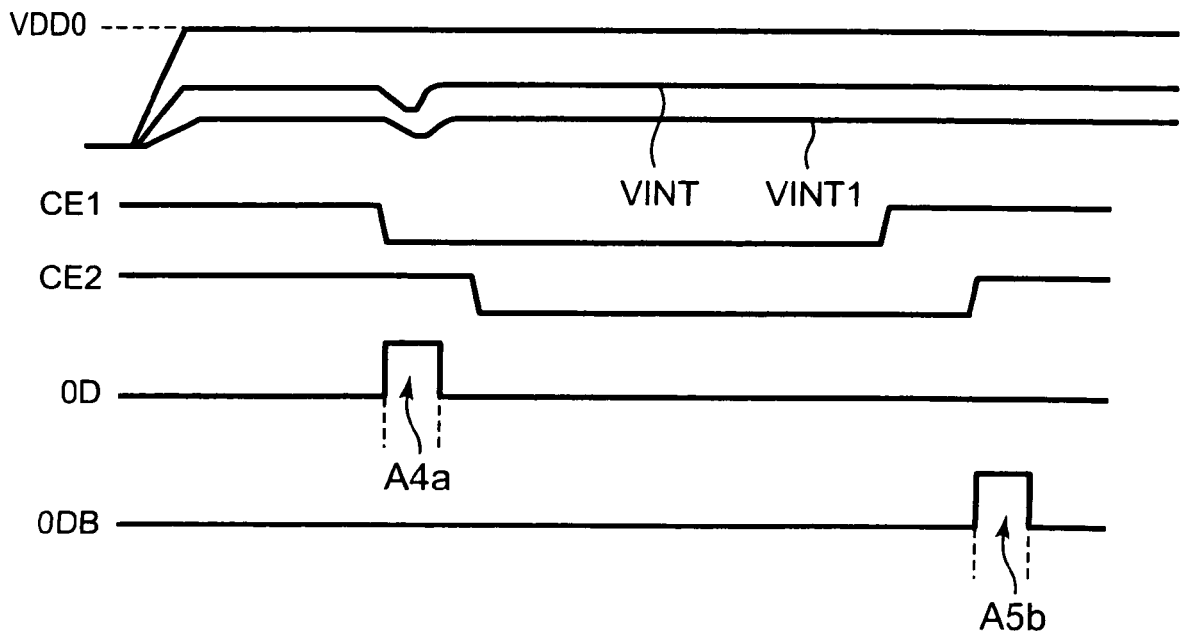
FIG. 13 is a timing chart for describing a variation of the semiconductor device shown in FIG. 11.

The step-down circuit 120 of the semiconductor device 600 is configured so as to carry out overdriving/overdriving backward synchronously with an activated/deactivated operation of the circuit group 140 and the activated/deactivated operation of the circuit group 640. Although the activation/deactivation timing differs between those circuit groups 140 and 640, if the other circuit group is activated while one circuit group is already active, then overdriving may be carried out only in a predetermined period when the precedingly activated circuit group is activated. Furthermore, if the other circuit group is already active when the operation of one circuit group is to be deactivated, then overdriving may be carried out only in a predetermined period when the circuit group to be deactivated later is deactivated. FIG. 13 shows how each signal changes in state in such a case. In this example, the circuit group 140 is activated first, then the circuit group 640 is activated. And the circuit group 140 is deactivated first, then the circuit group 640 is deactivated.

As shown in FIG. 13, in the first overdriving period A4*a* in which the circuit group 140 to be activated preceedingly is activated, the overdrive signal OD is turned on, thereby the step-down circuit 120 carries out overdriving. On the other hand, when the circuit group 640 to be activated while the circuit group 140 is active is activated, the overdrive signal OD is kept off, so no overdriving is carried out.

Furthermore, when the circuit group 140 to be deactivated first is deactivated, the overdrive backward signal ODB is kept off, so no overdriving backward is carried out. On the other hand, in the second overdriving backward period in which the circuit group 640 to be deactivated subsequently is deactivated, the overdrive backward signal ODB is turned on to enable overdriving backward to be carried out in the step-down circuit 120.

Seventh Exemplary Embodiment

Figure 14:
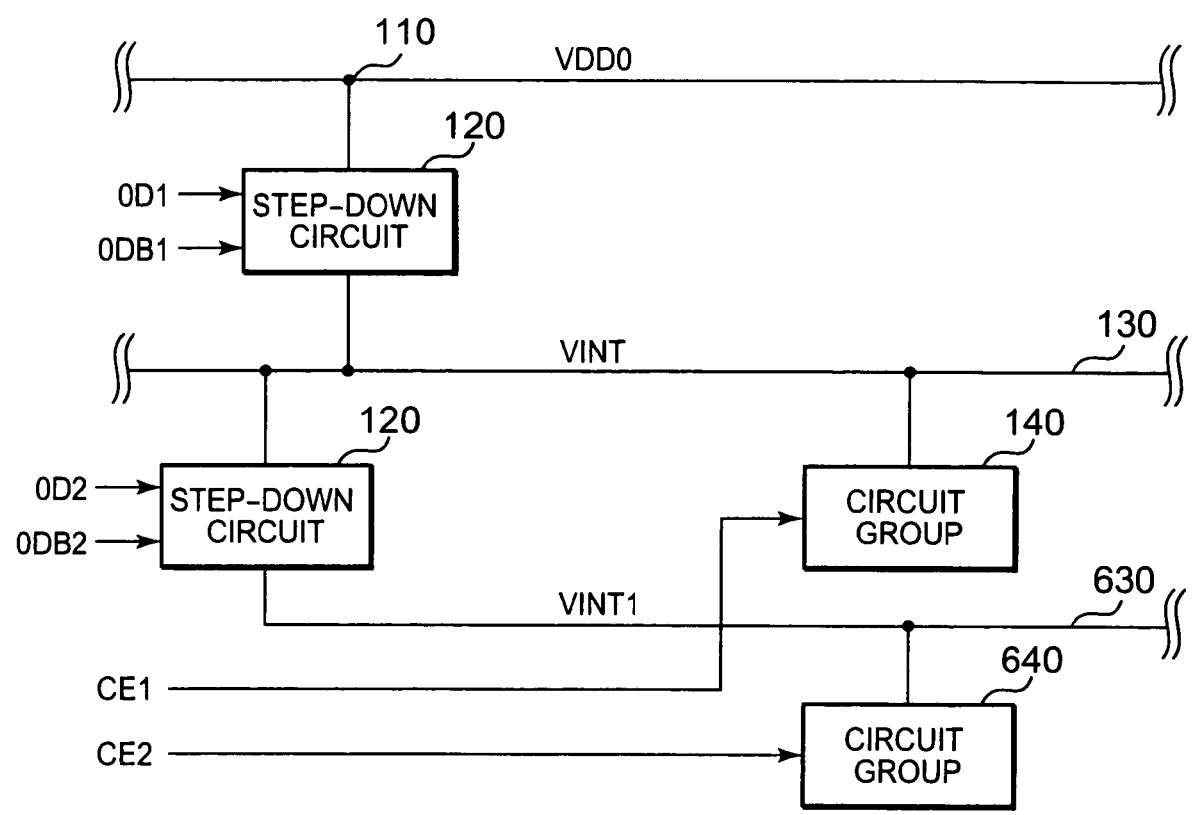
FIG. 14 is a block diagram of a semiconductor device in a seventh exemplary embodiment of the present invention.

In the semiconductor device 600 in the sixth exemplary embodiment and in its variation, plural step-down circuits are connected to each another serially and the overdriving/overdriving backward is carried out only in the step-down circuit disposed in the uppermost stream. If the technique of the present invention applies to a semiconductor device having plural step-down circuits connected to each another serially, then overdriving/backward driving may be carried out in each of those step-down circuits. FIG. 14 shows a semiconductor device 700 in such an embodiment.

The configuration of the semiconductor device 700 is the same as that of the semiconductor device 600 except for the overdriving/overdriving backward carried out in the step-down circuit 120 that steps down the voltage VINT of the internal power supply line 130 to the voltage VINT1 to be supplied to the circuit group 640.

Figure 15:
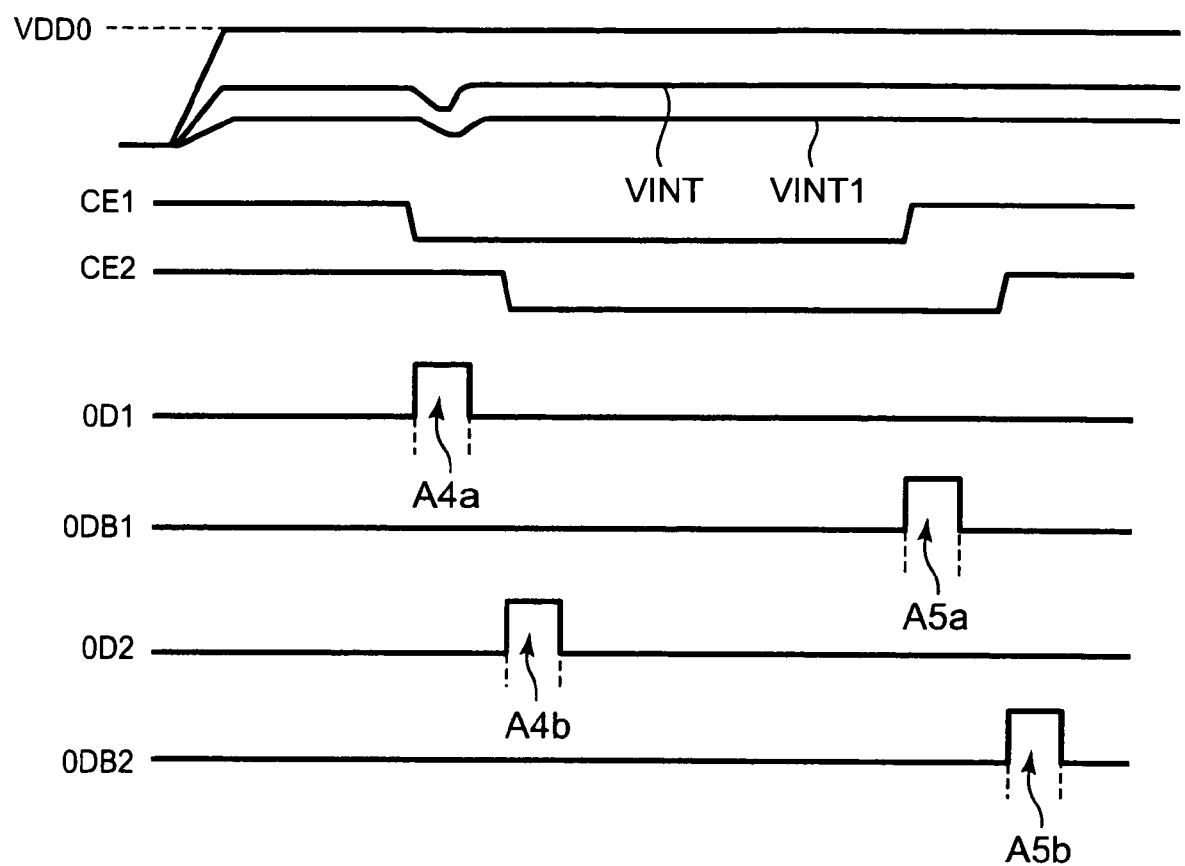
FIG. 15 is a timing chart for showing how each signal changes in state in the semiconductor device shown in FIG. 14.

As shown in FIG. 14, the step-down circuit 120 disposed in the first stage inputs the first overdrive signal OD1 and the first overdrive backward signal ODB1 and the step-down circuit 120 disposed in the second stage inputs the second overdrive signal OD2 and the second overdrive backward signal ODB2. FIG. 15 shows the on/off timings of those signals.

As shown in FIG. 15, in the first overdriving period A4*a* in which the circuit group 140 to be activated preceedingly is activated, the first overdrive signal OD1 is turned on while the second overdrive signal OD2 is kept off. Consequently, in the first stage overdriving period A4*a*, the first step-down circuit 120 carries out overdriving while the second stage step-down circuit 120 does not carry out overdriving.

In the second overdriving period A4*b* in which the circuit group 640 to be activated subsequently is activated, the first overdrive signal OD1 is kept off and the second overdrive signal OD2 is turned on. Consequently, in the second stage overdriving period A4*b*, the first stage step-down circuit 120 does not carry out overdriving while the second stage step-down circuit 120 carries out overdriving.

Furthermore, in the first overdriving backward period A5*a* in which the circuit group 140 to be deactivated preceedingly is deactivated, the first overdrive backward signal ODB1 is turned on while the second overdrive backward signal ODB2 is kept off Consequently, the first stage step-down circuit 120 carries out overdriving backward while the second stage step-down circuit 120 does not carry out overdriving backward.

And in the second overdriving backward period A5*b* in which the circuit group 640 to be deactivated subsequently is deactivated, the first overdrive backward signal ODB1 is kept off and the second overdrive backward signal ODB2 is turned on. Consequently, the first stage step-down circuit 120 does not carry out overdriving backward while the second stage step-down circuit 120 carries out overdriving backward.

Variation of the Seventh Exemplary Embodiment

Figure 16:
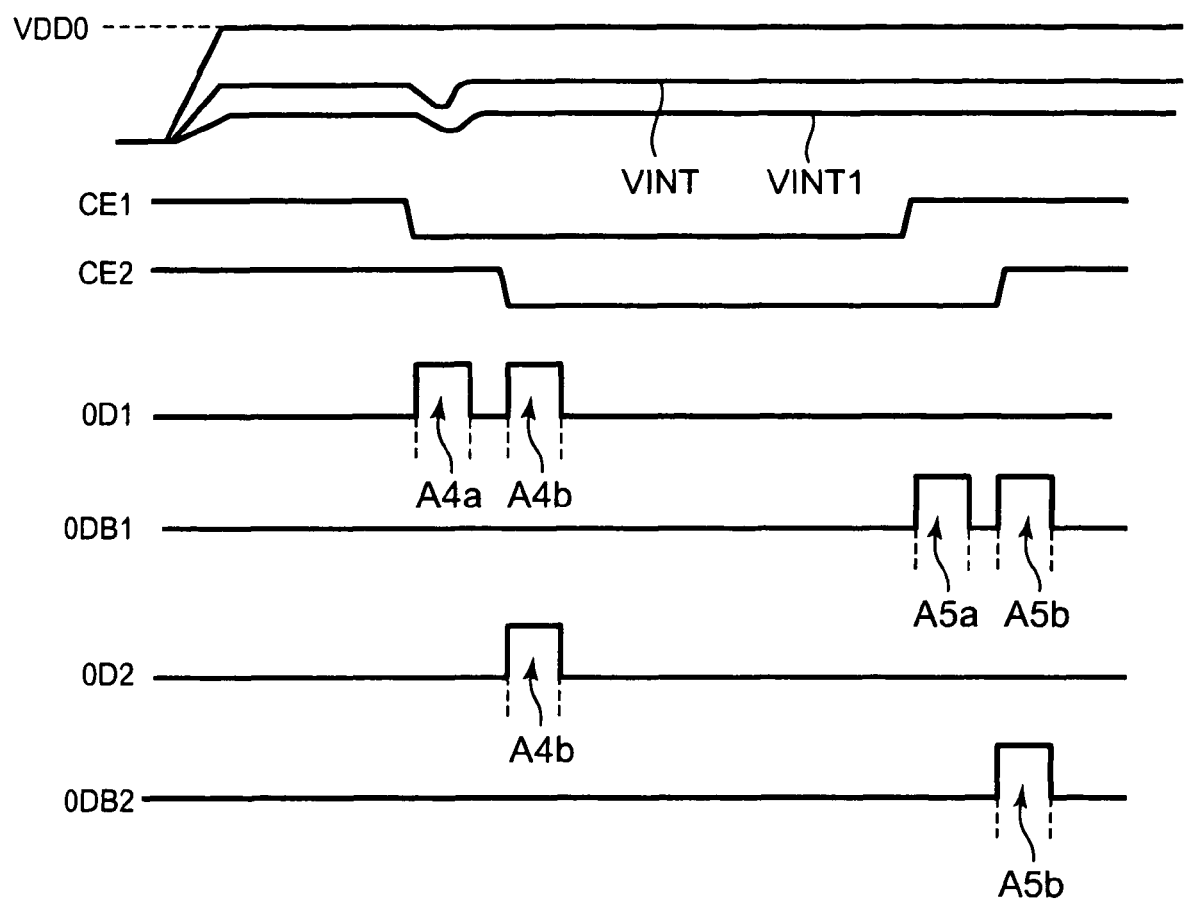
FIG. 16 is a timing chart for describing a variation of the semiconductor device shown in FIG. 14.
Figure 17:
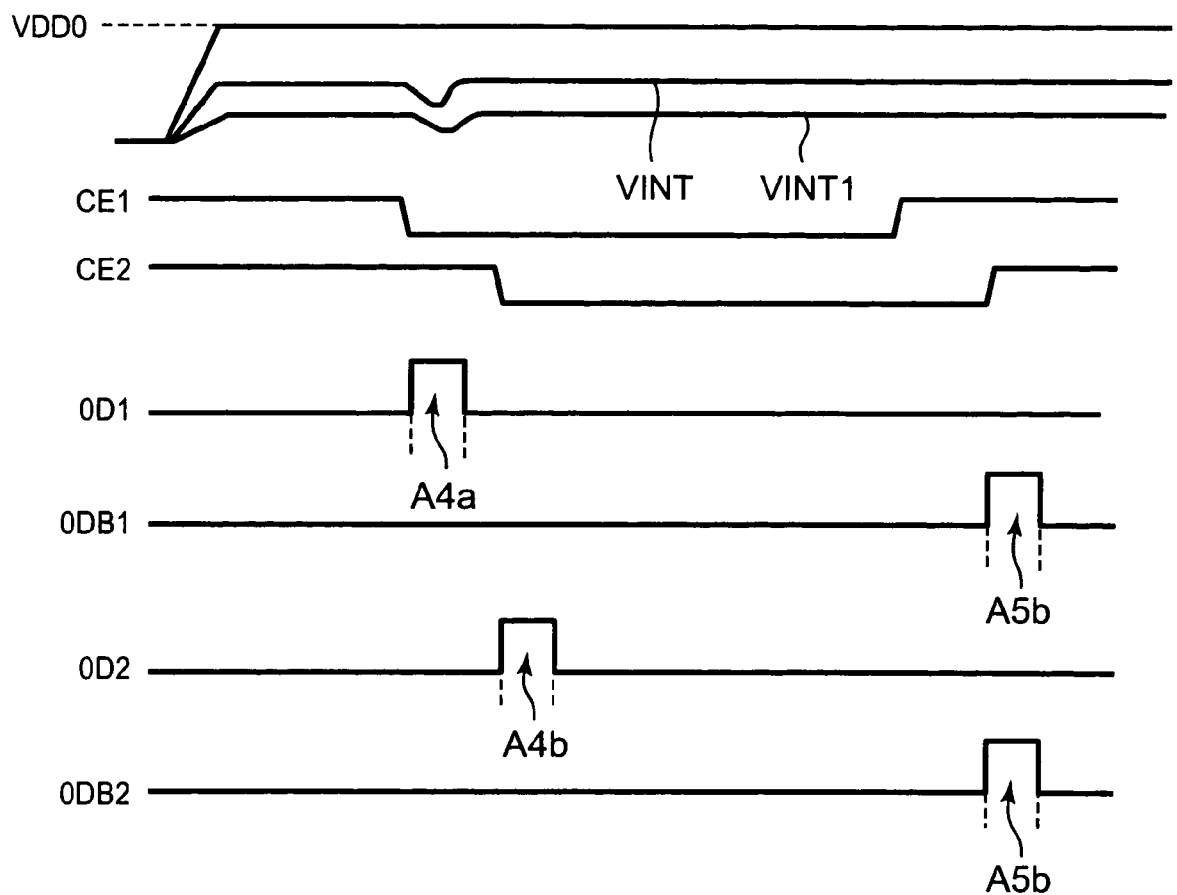
FIG. 17 is a timing chart for describing a variation of the semiconductor device shown in FIG. 14.

A variety of combinations are possible for carrying out overdriving/overdriving backward in the first and second stage step-down circuits 120 in a semiconductor device 700 in this seventh exemplary embodiment. FIGS. 16 and 17 show two examples of such combinations.

In the example shown in FIG. 16, the first overdrive signal OD1 is turned on in each of the first and second overdriving periods A4a and A4b and the first overdrive backward signal ODB1 is turned on in each of the first and second overdriving backward periods A5a and A5b. Consequently, the first stage step-down circuit 120 carries out overdriving in each of the first and second overdriving periods A4a and A4b and carries out overdriving backward in each of the first and second overdriving backward periods A5a and A5b.

On the other hand, the second overdrive signal OD2 is turned on only in the second overdriving period A4b and the second overdrive backward signal ODB2 is turned on only in the second overdriving backward period A5b. Consequently, the second stage step-down circuit 120 carries out overdriving only in the second overdriving period A4b and overdriving backward only in the second overdriving backward period A5b.

In the example shown in FIG. 17, the on/off timings of the second overdrive signal OD2 and the second overdrive backward signal ODB2 are the same as those in the example shown in FIG. 16. However, the first overdrive signal OD1 is turned on only in the first overdriving period A4a and the first overdrive backward signal ODB1 is turned on only in the first overdriving backward period A5a. Consequently, the first stage step-down circuit 120 carries out overdriving only in the first overdriving period A4a and overdriving backward only in the first overdriving backward period A5a.

The variation of each of the embodiments described above, as well as any of combinations of those variations can apply to any semiconductor device that requires a step-down circuit. Employment of any of those variations and combinations can improve the power supply responsibility and assure the fast operation of any object circuit effectively even at the activation/deactivation timing thereof.

Eighth Exemplary Embodiment

Next, there will be described how to apply the embodiments described above to such semiconductor devices as DRAM, SRAM, etc. Although any of the above-described embodiments can apply to those semiconductors, a combination of the third and fourth exemplary embodiments shown in FIGS. 4 and 6 will be picked up as such an application example, which will be then described as an eighth exemplary embodiment below. The semiconductor device 300 in the third exemplary embodiment has plural step-down circuits connected to each another in parallel and overdriving/overdriving backward is carried out only in a step-down circuit that supplies a current to a much current consuming circuit. The semiconductor device 400 in the fourth exemplary embodiment also has plural step-down circuits connected to each another in parallel and overdriving/overdriving backward is carried out for object circuits and the activation/deactivation timing is different among those object circuits.

Figure 18:
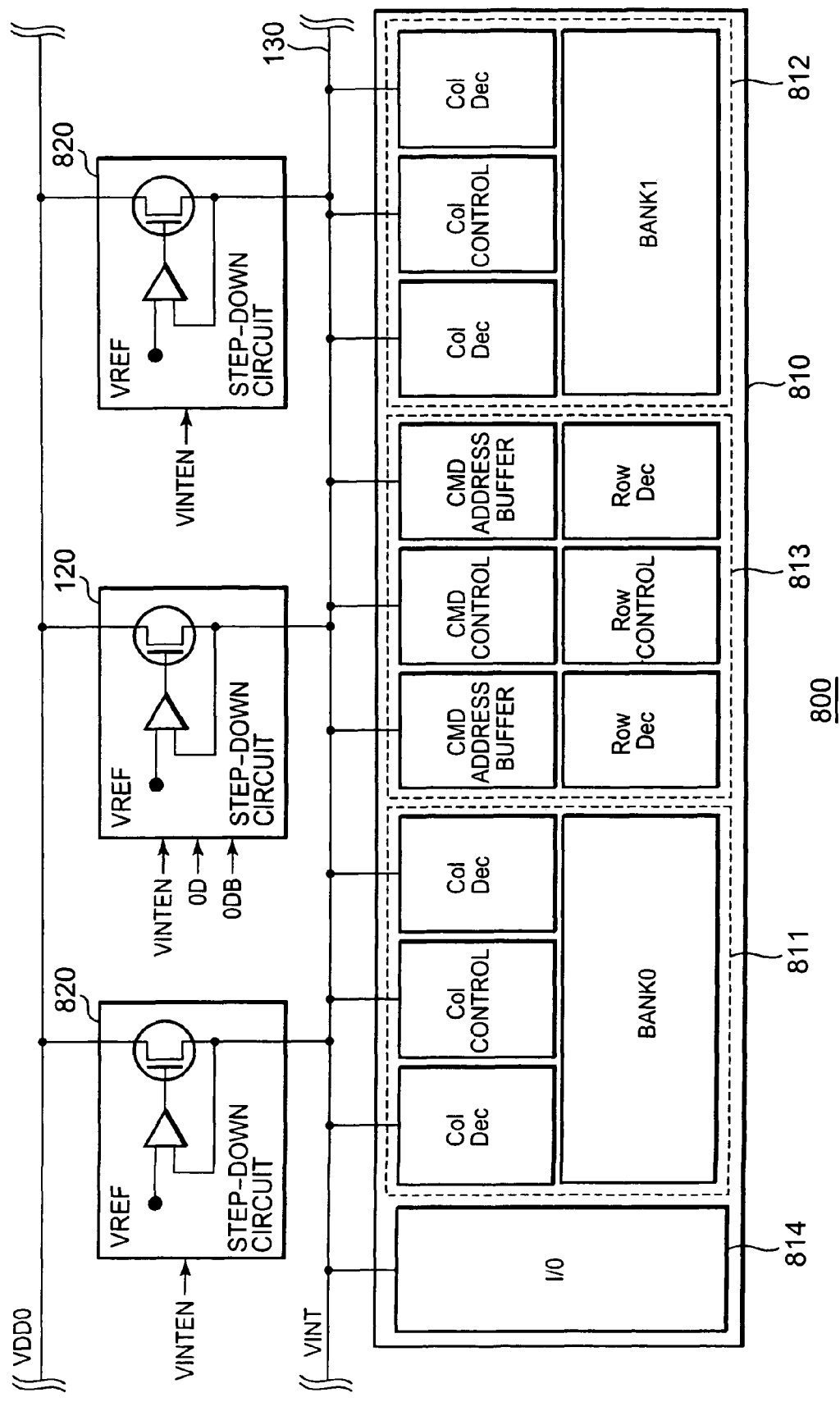
FIG. 18 is a block diagram of a semiconductor device in an eighth exemplary embodiment of the present invention.

FIG. 18 shows a semiconductor device 800 in this eighth exemplary embodiment. In FIG. 18, the same reference numerals are used for the same functional components as those in the embodiments described above, avoiding redundant description.

As shown in FIG. 18, the semiconductor device 800 includes plural step-down circuits (three in the figure) connected to each another in parallel between a system supply voltage VDD0 and an internal power supply line 130, as well as a memory circuit 810. The memory circuit 810 includes plural memory cell arrays (two in the figure), a peripheral logic 813, and an I/O interface (hereunder, to be referred as an I/O simply) 814. Each memory cell array includes a column decoder (ColDec), a column controller (Col Control), and a memory bank (BANK) disposed therein. The peripheral logic 813 includes a command address buffer (CMD address Buffer) and a command controller (CMD Control) disposed therein. Although the column decoder and the column controller are included in the peripheral logic, they are shown in the memory array to simplify the description. Furthermore, internal connection lines and signals disposed and exchanged between functional blocks in the memory circuit are omitted here.

Each of the step-down circuit 120 and the two step-down circuits 820 steps down the system supply voltage VDD0 to the voltage VINT to be supplied to the memory circuit 810. Among those three step-down circuits, the step-down circuit 120 can carry out overdriving/overdriving backward and other two step-down circuits 810 are ordinary step-down circuits that do not carry out overdriving/overdriving backward.

The memory circuit is activated synchronously with a read/write access to any of the memory banks. Upon such an access, the command controller (CMD Control) and the command address buffer (CMD Address Buffer) included in the peripheral logic 813 come to have the maximum current consumption respectively. In this embodiment, therefore, the step-down circuit 120 that carries out overdriving/overdriving backward supplies a current to the peripheral logic 813.

Figure 19:
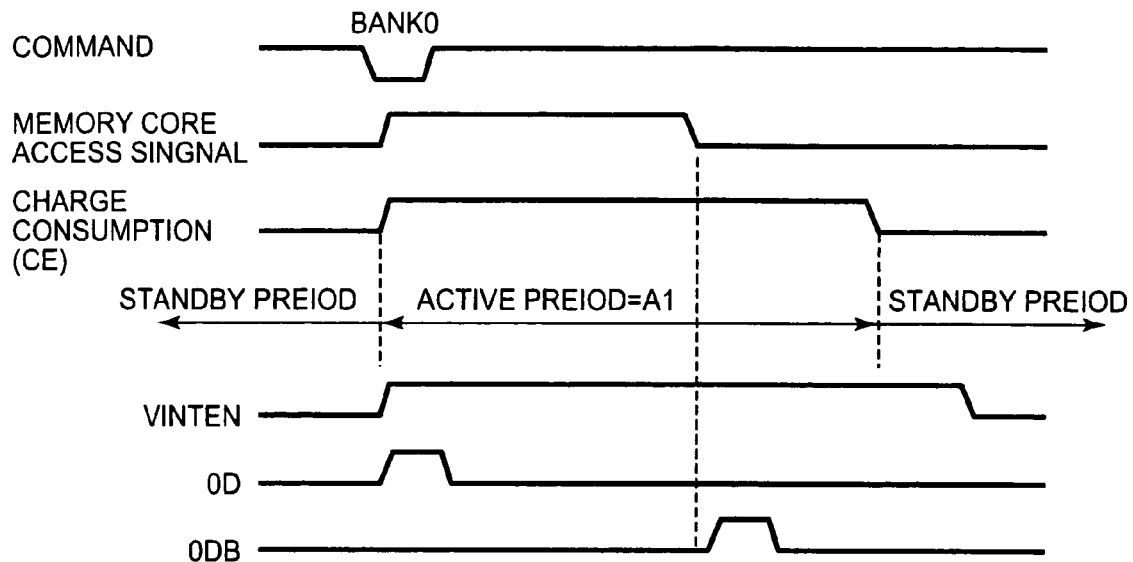
FIG. 19 is a timing chart for showing how each signal changes in state in the semiconductor device shown in FIG. 18.

FIG. 19 shows how each signal changes in state and how the charge consumption of the memory circuit 810 changes in the semiconductor device 800 when any of the memory banks is accessed. In this example, it is assumed that the BANK0 is accessed.

As shown in FIG. 19, if the BANK0 receives an access command, the memory core access signal (not shown) is turned on and accordingly, the peripheral logic 813 and the memory cell array 811 are activated, thereby the memory circuit 810 comes to begin discharging.

The memory access signal is kept on until the memory cell array 811 and the peripheral logic 813 are deactivated. And even when the memory cell array 811 and the peripheral logic 813 are deactivated, the I/O 814 is still active to input/output data. Thus, the memory circuit 810 keeps discharging. When the I/O 814 is also deactivated, the charge consumption of the memory circuit 810 becomes zero (0). In other words, the period in which the whole memory circuit 810 consumes the charge is equivalent to the period (active period A1) in which the circuit activation enable signal CE is turned on in each of the embodiments described above.

The power supply enable signal VINTEN is also turned on synchronously with the activation of the memory circuit 810. The power supply enable signal VINTEN is turned off synchronously with the intermittent accesses to the memory banks and later than the deactivation timings of the memory circuit 810 and the peripheral logic 813 respectively because of taking the consideration to the power ground resistance, etc.

The overdrive signal OD input to the step-down circuit 120 is turned on synchronously with the turning-on of the power supply enable signal VINTEN and kept on for a predetermined period.

The overdrive backward signal ODB input to the step-down circuit 120 is kept on in a predetermined period that follows the turning-on period of the overdrive signal OD, that is, after the overdriving period is over. As shown in FIG. 19, the overdrive backward signal ODB is turned on synchronously with the turning-off of the memory core access signal before the deactivation timing of the whole memory circuit 810, not at the deactivation timing of the circuit 810.

In other words, in this embodiment, overdriving is carried out synchronously with the activation of the whole memory circuit 810 while overdriving backward is carried out synchronously with the deactivation of the block having the largest charge consumption in the memory circuit 810. In such a way, the overdriving and overdriving backward timings may be optimized for the charge consumption pattern of the object circuit; they may not be limited only to the activation/deactivation of the object circuit of the step-down circuit.

Figure 20:
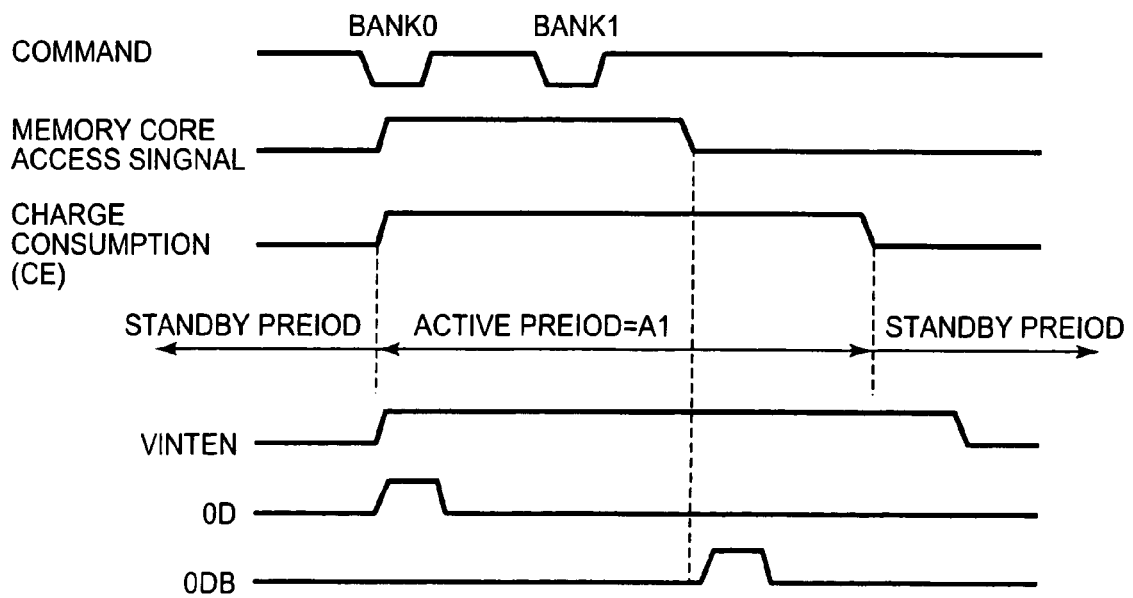
FIG. 20 is a timing chart for showing how each signal changes in state in the semiconductor device shown in FIG. 18.
Figure 21:
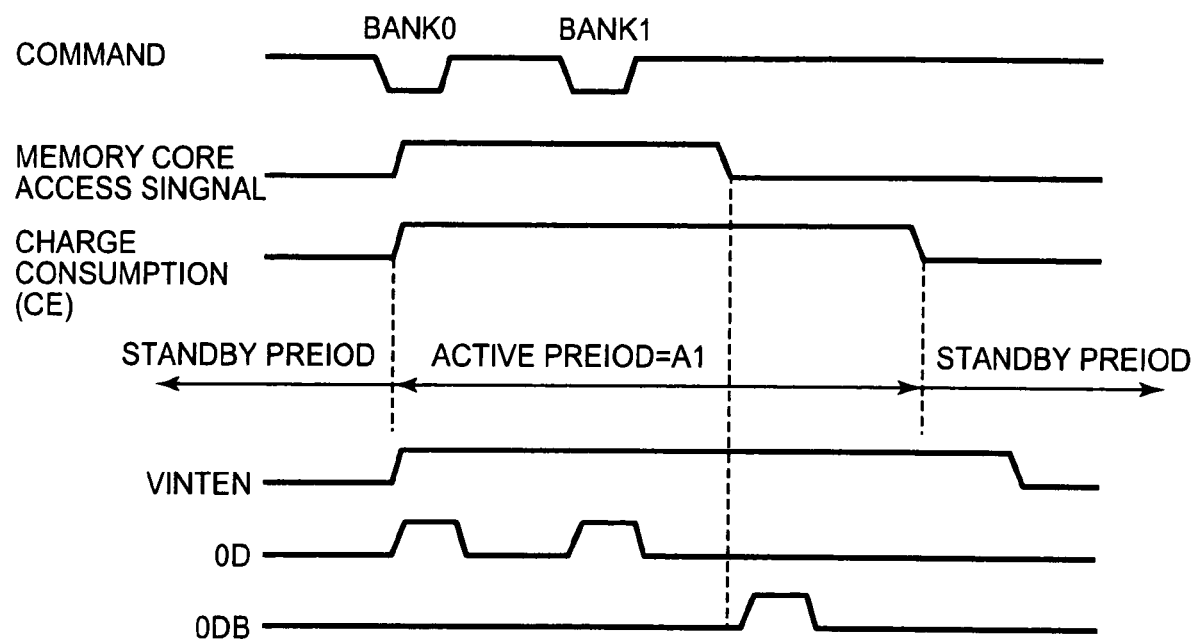
FIG. 21 is a timing chart for describing a variation of the semiconductor device shown in FIG. 18.

FIG. 20 shows how each signal changes in state upon consecutive accesses to the BANK0 and BANK1. In this case, the memory core access signal is turned on synchronously with the activation of the peripheral logic 813 and the memory cell array 811 respectively triggered by the preceding access. The memory core access signal is turned off synchronously with the deactivation of both of the peripheral logic 813 and the memory cell array 812.

As shown in FIG. 20, in this case, the overdrive signal OD input to the step-down circuit 120 is turned on in a predetermined period synchronously with the start of the access to the BANK0 while the overdrive backward signal ODB is turned on in a predetermined period synchronously with the deactivation of the peripheral logic 813 and the memory cell array 812, which are triggered by the end of the access to the BANK1.

In other words, in the example shown in FIG. 20, the memory cell array 811, the memory cell array 812, and the peripheral logic 813 are regarded as an integrated one circuit group logically and overdriving/overdriving backward is carried out synchronously with the activation/deactivation of this circuit group.

In this case, it is also possible to carry out overdriving in response to each access to each of the banks. As shown in FIG. 12, each time either the BANK0 or BANK1 is accessed, the overdrive signal OD is turned on synchronously with the start of the access.

In this case, an activation signal to be turned on at each activation of the BANK0 and BANK1 may be output and an OR signal of those two activation signals may be used as the overdrive signal OD.

This completes the description of the present invention with respect to the first to eighth exemplary embodiments. While the exemplary forms of the present invention have been described, it is to be understood that modifications will be apparent to those skilled in the art without departing from the spirit of the invention.

For example, in each of the above embodiments, the step-down circuit 120 shown in FIG. 2 has been described as a step-down circuit that has employed the technique of the present invention. However, the circuit configuration is not limited only to the step-down circuit 120; it may be any step-down circuit if it can realize the same functions as those of the step-down circuit 120.

Figure 22:
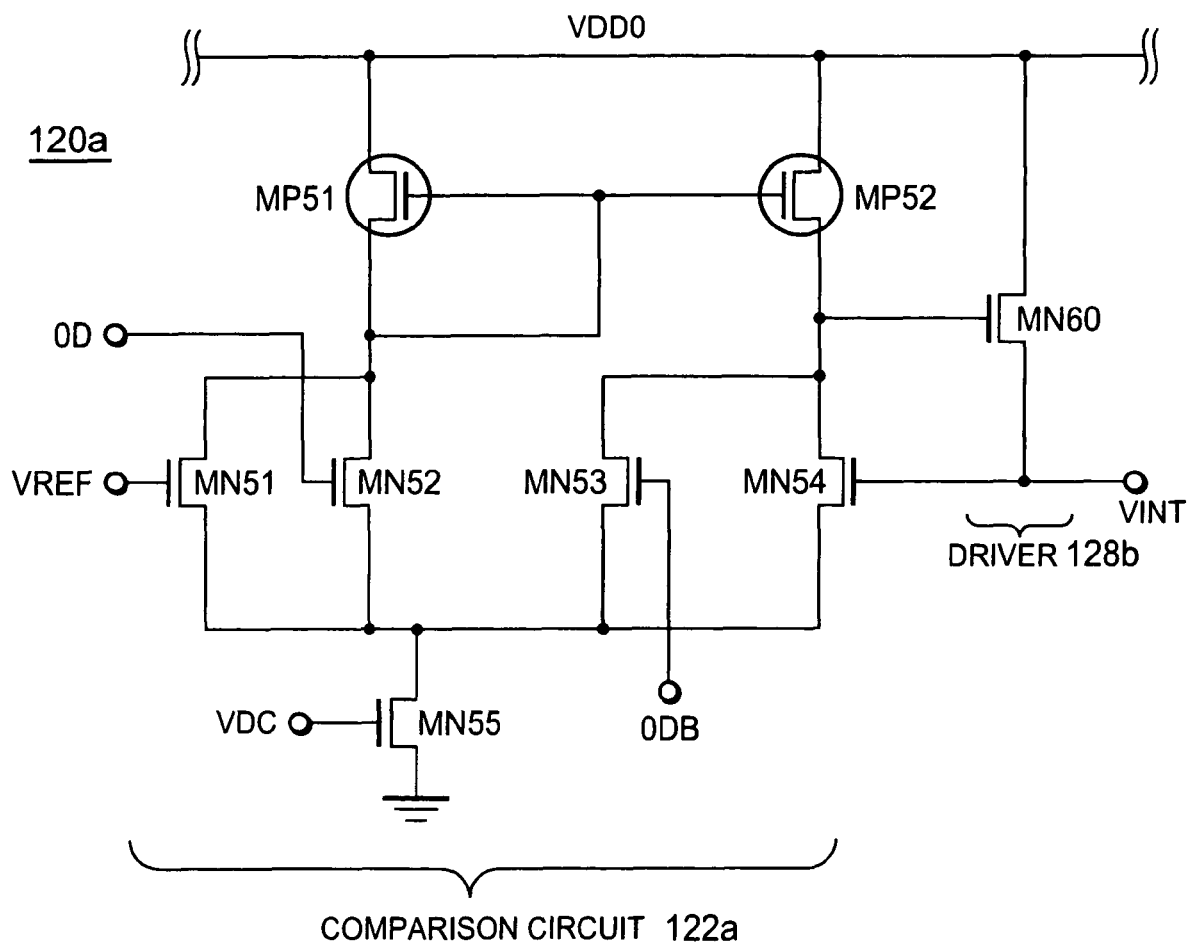
FIG. 22 is a circuit diagram of a step-down circuit replaceable with the step-down circuit shown in FIG. 2.
Figure 23:
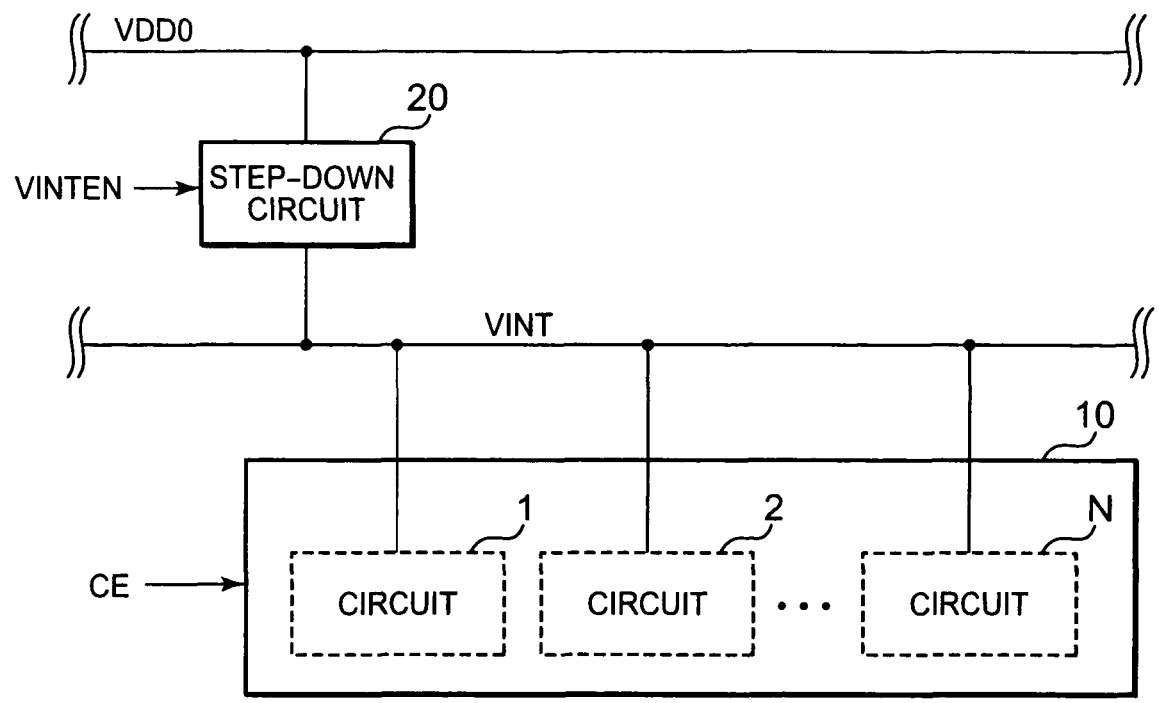
FIG. 23 is an explanatory diagram of a conventional step-down circuit.
Figure 24:
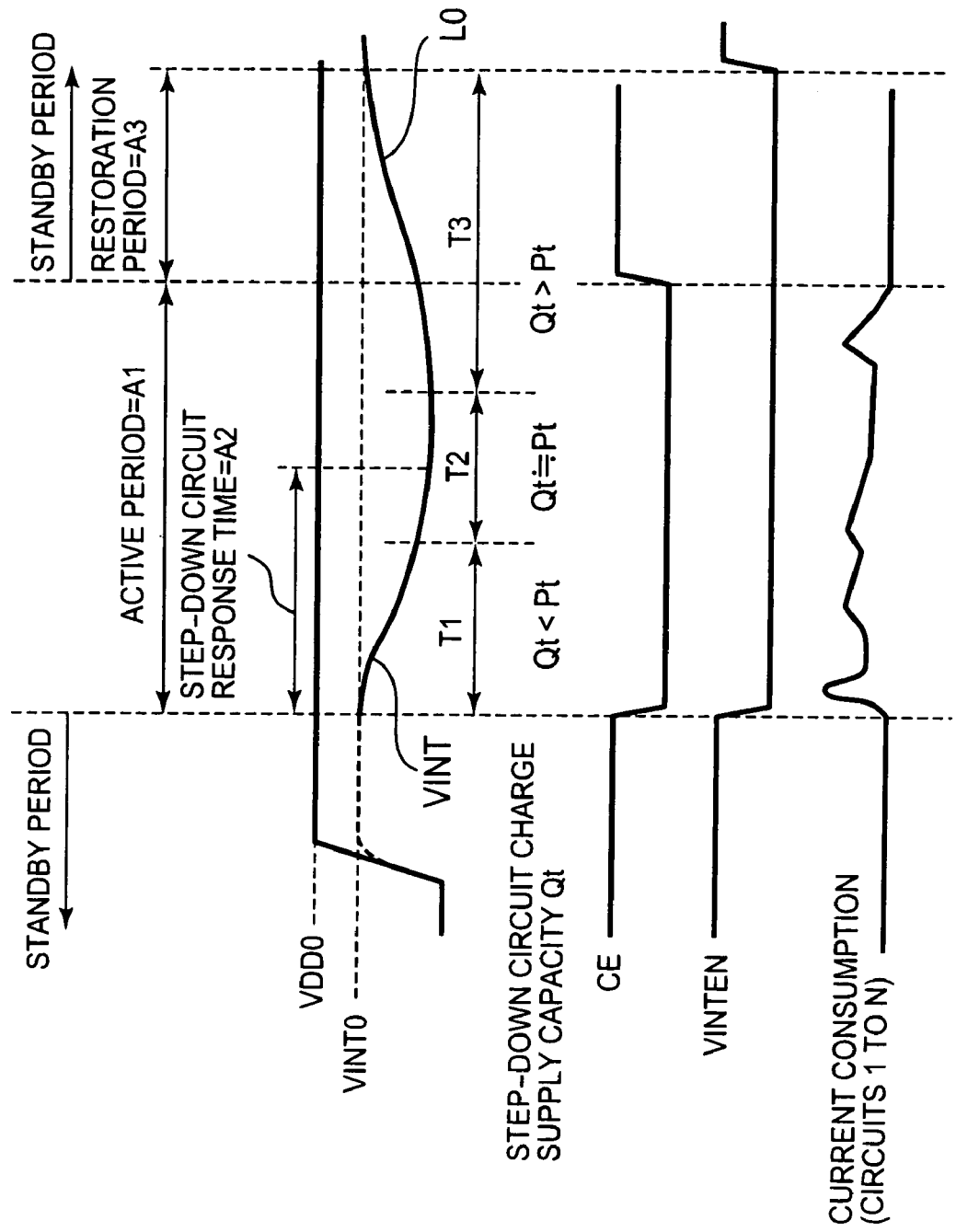
FIG. 24 is a timing chart for showing how each signal changes in state in the step-down circuit shown in FIG. 23.
Figure 25:
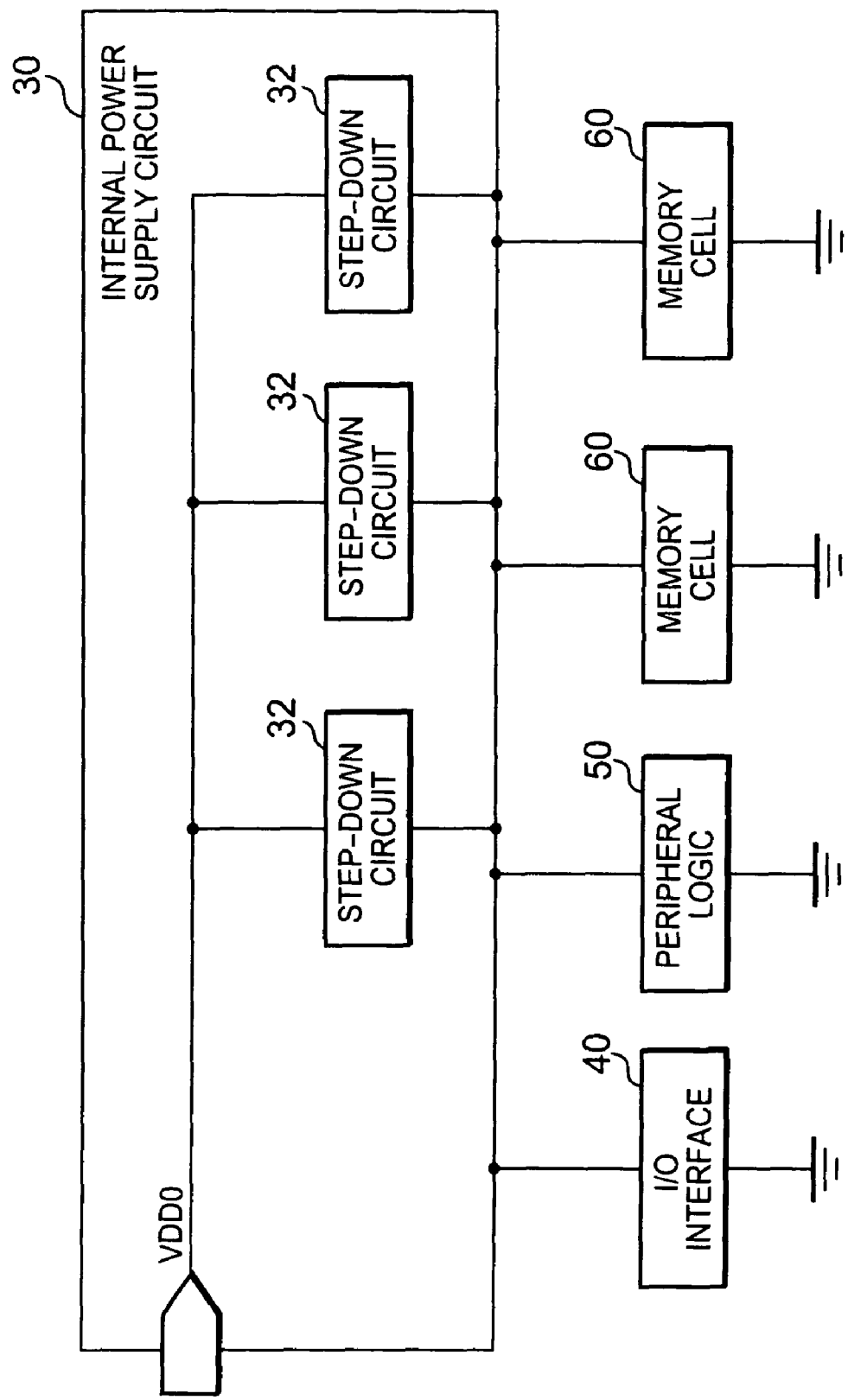
FIG. 25 is an explanatory diagram for showing memory cells and a conventional internal power supply circuit provided around those memory cells.
Figure 26:
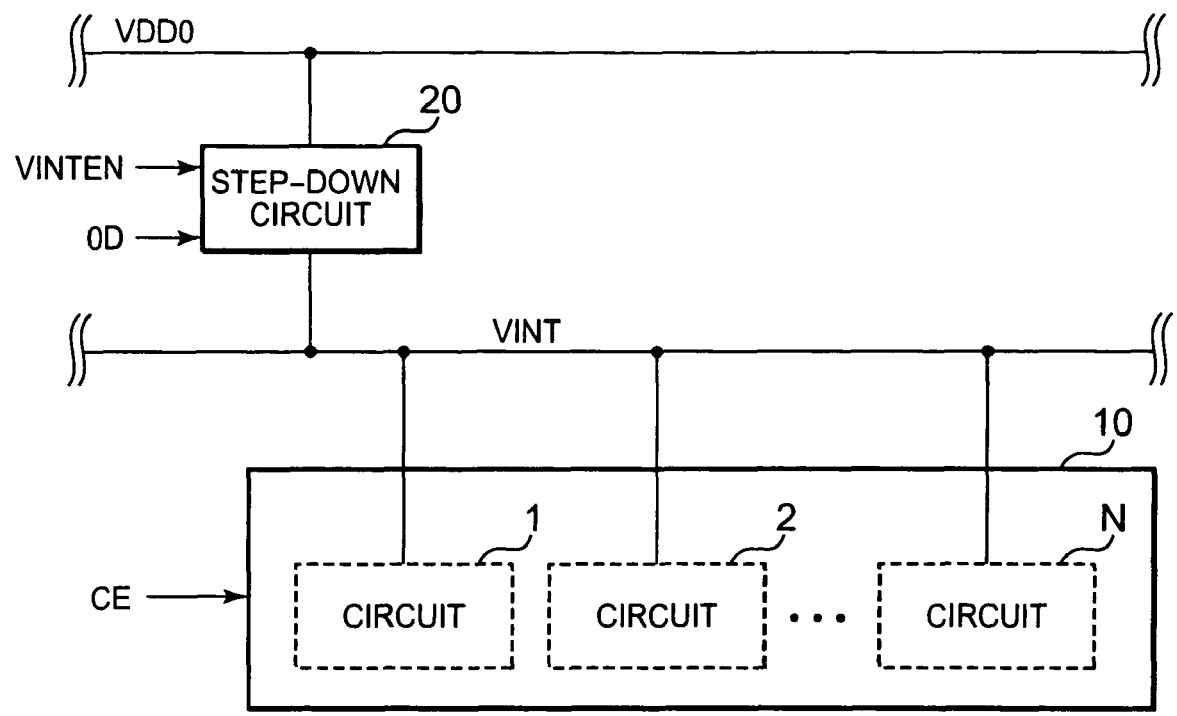
FIG. 26 is an explanatory diagram for showing a conventional circuit that carries out overdriving.

FIG. 22 shows a step-down circuit 120a of which configuration differs from that of the step-down circuit 120. The step-down circuit 120a includes a comparison circuit 122a and a driver 128a. The driver 128a includes N-channel MOS transistors MN60 and the comparison circuit 122a includes N channel MOS transistors MN51 to MN55 and P-channel MOS transistors MP51 and MP52. An MP51 and an MP51 makes a current mirror and an MN51 and an MN54 makes a differential pair. The MN52 and the MN51 are connected to each other in parallel while the MN53 and the MN54 are connected to each other in parallel. The MN52 and the MN53 input the overdrive signal OD and the overdrive backward signal ODB respectively.

The step-down circuit 122a can realize the same functions of the step-down circuit 120 by turning on/off the overdrive signal OD and the overdrive backward signal ODB at the same timings as those of the step-down circuit 120 with respect to the comparison circuit 122a configured as shown in FIG. 22.

Furthermore, for example, the semiconductor device 800 in the eighth exemplary embodiment shown in FIG. 18 includes a memory cell array, a peripheral logic, etc. connected to the same internal power supply line. The operation voltage might be different between the memory cell array and the peripheral logic in some semiconductor devices. Usually, the operation voltage of the memory cell array is lower than that of the peripheral logic. In such a case, for example, the operation voltage employed for the fifth exemplary embodiment shown in FIG. 9 and its variation may be used. Concretely, the peripheral logic in the circuit group 140 can be connected to the internal power supply line 130 and the plural memory cell arrays of the circuit group 540 can be connected to the internal power supply line 530.

Further, it is noted that Applicant's intent is to encompass equivalents of all claim elements, even if amended later during prosecution.

What is claimed is:

1. A step-down circuit connected between a power supply node that supplies a supply voltage and an internal power supply line, to produce a step-down voltage from the supply voltage and apply the step-down voltage to an object circuit through the internal power supply line, the step-down circuit comprising:
    a comparison circuit that compares a reference voltage with a voltage of the internal power supply line, said comparison circuit including a first current path activated by a first signal and a second current path activated by a second signal; and
    a driver that adjusts a current flowing between the internal power supply line and the power supply node according to a comparison result of the comparison circuit,
    wherein an activity level of the driver is controlled to rise to a predetermined high period synchronously with an activated operation of the object circuit in response to the reference voltage and a current of said first current path and fall to a predetermined low period that comes after the high period in response to the reference voltage and a current of said second current path.

2. The step-down circuit according to claim 1, wherein the high period comprises a predetermined period beginning at the activated operation of the object circuit.

3. The step-down circuit according to claim 1, wherein the low period comprises a predetermined period synchronized with a deactivated operation of the object circuit.

4. The step-down circuit according to claim 3, wherein the low period comprises a predetermined period beginning at the deactivated operation of the object circuit.

5. The step-down circuit according to claim 1, wherein the object circuit includes a plurality of internal circuits to be activated at different timings, respectively, and
wherein the high period is provided for each of the internal circuits differently.

6. The step-down circuit according to claim 1, wherein the object circuit includes a plurality of internal circuits to be activated at different timings, respectively, and
wherein the high period is provided for a predetermined internal circuit to be activated first among the internal circuits, and the high period is not provided for remaining ones of the internal circuits to be activated during an operation of the predetermined internal circuit.

7. The step-down circuit according to claim 1, wherein the object circuit includes a plurality of internal circuits to be deactivated at different timings, respectively, and
wherein the low period is provided for each of the internal circuits differently.

8. The step-down circuit according to claim 1, wherein the object circuit includes a plurality of internal circuits to be deactivated at different timings, respectively, and
wherein when an internal circuit is still active when a predetermined internal circuit among the plurality of internal circuits is deactivated, the low period is not provided for the predetermined internal circuit and the low period is provided for the still active internal circuit.

9. A semiconductor device, comprising:
an object circuit;
an internal power supply line connected to the object circuit; and
a step-down circuit, connected between a power supply node that supplies a supply voltage and the internal power supply line, to produce a step-down voltage from the supply voltage to apply the step-down voltage to the object circuit through the internal power supply line,
wherein the step-down circuit comprises:
a comparison circuit that compares a reference voltage with a voltage of the internal power supply line, said comparison circuit including a first current path activated by a first signal and a second current path activated by a second signal; and
a driver that adjusts a current flowing between the internal power supply line and the power supply node according to a comparison result of the comparison circuit, and
wherein an activity level of the driver is controlled to rise to a predetermined high period synchronously with an activated operation of the object-circuit in response to the reference voltage and a current of said first current path and fall to a predetermined low period that comes after the high period in response to the reference voltage and a current of said second current path.

10. The semiconductor device according to claim 9, wherein the high period comprises a predetermined period beginning at the activated operation of the object circuit.

11. The semiconductor device according to claim 9, wherein the low period comprises a predetermined period synchronized with a deactivated operation of the object circuit.

12. The semiconductor device according to claim 11, wherein the low period comprises a predetermined period beginning at the deactivated operation of the object circuit.

13. The semiconductor device according to claim 9, wherein the object circuit includes a plurality of internal circuits to be activated at different timings, respectively, and
wherein the high period is provided for each of the internal circuits differently.

14. The semiconductor device according to claim 9, wherein the object circuit includes a plurality of internal circuits to be activated at different timings, respectively, and
wherein the high period is provided for a predetermined internal circuit to be activated first among the plurality of internal circuits and the high period is not provided for any remaining ones of the internal circuits to be activated during an operation of the predetermined internal circuit.

15. The semiconductor device according to claim 9, wherein the object circuit includes a plurality of internal circuits to be deactivated at different timings, respectively, and
wherein the low period is provided for each of the internal circuits differently.

16. The semiconductor device according to claim 9, wherein the object circuit includes a plurality of internal circuits to be deactivated at different timings, respectively, and
wherein when an internal circuit is active when a predetermined internal circuit among the plurality of internal circuits is deactivated, the low period is not provided for the predetermined internal circuit, and the low period is provided for the still active internal circuit.

17. The semiconductor device according to claim 13, wherein the step-down circuit is provided near an internal circuit having a highest current consumption among the plurality of internal circuits.

18. The semiconductor device according to claim 13, wherein a plurality of ones of the step-down circuit are connected to each other in parallel between the power supply node and the internal power supply line.

19. The semiconductor device according to claim 13, wherein the semiconductor device comprises a memory device, and
wherein the object circuit includes a memory cell array and a peripheral logic circuit.

20. The semiconductor device according to claim 9, wherein the object circuit comprises a first object circuit, the internal power supply line comprises a first internal power supply line, and the step-down circuit comprises a first step-down circuit,
wherein the semiconductor device further comprises:
a second object circuit;
a second internal power supply line connected to the second object circuit; and
a second step-down circuit, connected between the first internal power supply line and the second internal power supply line, and supply the stepped-down voltage to the second object circuit through the second internal power supply line, and
wherein the second step-down circuit is operated with the high period and the low period.

21. The semiconductor device according to claim 20, wherein the comparison circuit comprises a first comparison circuit, the reference voltage comprises a first reference voltage, and the driver comprises a first driver,
wherein the second step-down circuit comprises:
a second comparison circuit that compares a second reference voltage that is lower than the first reference voltage with a voltage of the second internal power supply line; and a second driver that adjusts a current flowing between the first and second internal power supply lines according to a comparison result of the second comparison circuit; and wherein the activity level of the second driver is controlled to rise in a predetermined high period synchronously with an activated operation of the second object circuit, and to fall in a predetermined low period that comes after the high period.

22. The semiconductor device according to claim 20, wherein the semiconductor device comprises a memory device, wherein the first object circuit includes a peripheral logic circuit, and wherein the second object circuit includes one or more memory cell arrays.

23. A method of controlling a step-down circuit connected between a power supply node that supplies a supply voltage and an internal power supply line that supplies a power to an object circuit, to produce a step-down supply voltage to apply the step-down supply voltage to the object circuit through the internal power supply line, and wherein the step-down circuit comprises:

a comparison circuit that compares a voltage of the internal power supply line with a reference voltage, said comparison circuit including a first current path activated by a first signal and a second current path activated by a second signal; and a driver that adjusts a current flowing between the internal power supply line and the power supply node according to a comparison result of the comparison circuit, the method comprising:

increasing an activity level of the driver to a predetermined high period synchronously with an activated operation of the object circuit in response to the reference voltage and a current of said first current path; and decreasing the activity level of the driver to a predetermined low period that comes after the high period in response to the reference voltage and a current of said second current path.

* * * * *